(12) United States Patent
Sokolov et al.

(10) Patent No.: US 10,818,860 B2
(45) Date of Patent: Oct. 27, 2020

(54) QUANTUM DOT LIGHT EMITTING DEVICES

(71) Applicants: DOW GLOBAL TECHNOLOGIES LLC, Midland, MI (US); ROHM AND HAAS ELECTRONIC MATERIALS LLC, Marlborough, MA (US)

(72) Inventors: Anatoliy N Sokolov, Midland, MI (US); Brian Goodfellow, Midland, MI (US); Robert David Grigg, Midland, MI (US); Liam P Spencer, Lake Jackson, TX (US); John W Kramer, Midland, MI (US); David D Devore, Midland, MI (US); Sukrit Mukhopadhyay, Midland, MI (US); Peter Trefonas, III, Marlborough, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 0 days.

(21) Appl. No.: 16/311,186

(22) PCT Filed: Jun. 26, 2017

(86) PCT No.: PCT/US2017/039191
§ 371 (c)(1),
(2) Date: Dec. 19, 2018

(87) PCT Pub. No.: WO2018/005318
PCT Pub. Date: Jan. 4, 2018

(65) Prior Publication Data
US 2019/0334106 A1    Oct. 31, 2019

Related U.S. Application Data

(60) Provisional application No. 62/417,539, filed on Nov. 4, 2016.

(30) Foreign Application Priority Data

Jun. 28, 2016  (WO) ............... PCT/CN2016/087409
Jun. 28, 2016  (WO) ............... PCT/CN2016/087413
Nov. 7, 2016   (WO) ............... PCT/CN2016/104856
Dec. 28, 2016  (WO) ............... PCT/CN2016/112579

(51) Int. Cl.
*H01L 51/50* (2006.01)
*H01L 51/00* (2006.01)
*H01L 51/52* (2006.01)
*H01L 51/56* (2006.01)

(52) U.S. Cl.
CPC ........ *H01L 51/502* (2013.01); *H01L 51/0039* (2013.01); *H01L 51/0003* (2013.01); *H01L 51/0021* (2013.01); *H01L 51/5056* (2013.01); *H01L 51/5088* (2013.01); *H01L 51/5206* (2013.01); *H01L 51/5221* (2013.01); *H01L 51/56* (2013.01); *H01L 2251/301* (2013.01); *H01L 2251/308* (2013.01); *H01L 2251/556* (2013.01); *H01L 2251/558* (2013.01)

(58) Field of Classification Search
CPC ..................................................... H01L 51/502
USPC ................................................................ 257/13
See application file for complete search history.

(56) References Cited

U.S. PATENT DOCUMENTS

| 9,836,699 B1 * | 12/2017 | Rigetti ................. H01L 39/223 |
| 2010/0308754 A1 | 12/2010 | Gough et al. |
| 2012/0181915 A1 * | 7/2012 | Yamamoto .......... H01L 51/5237 313/46 |
| 2015/0243837 A1 | 8/2015 | Shim et al. |

FOREIGN PATENT DOCUMENTS

| EP | 2778124 A1 * | 9/2014 | ............. B82Y 30/00 |
| GB | 2516930 A * | 2/2015 | ............. H05B 33/14 |
| GB | 2516930 A | 2/2015 | |

OTHER PUBLICATIONS

Grim et al. "A sustainable future for photonic colloidal nanocrystals" Chem. Soc. Reviews, vol. 44, No. 16, pp. 5897-5914 (2015).

* cited by examiner

*Primary Examiner* — Ajay Arora
(74) *Attorney, Agent, or Firm* — G. Creston Campbell

(57) ABSTRACT

The present invention provides a quantum dot light emitting diode comprising i) an emitting layer of at least one semiconductor nanoparticle made from semiconductor materials selected from the group consisting of Group II-VI compounds, Group II-V compounds, Group III-VI compounds, Group III-V compounds, Group IV-VI compounds, Group I-III-VI compounds, Group II-IV-VI compounds, Group II-IV-V compounds, or any combination thereof; and ii) a polymer for hole injection or hole transport layer; and the polymer comprises, as polymerized units, at least one or more monomers having a first monomer structure comprising a) a polymerizable group, b) an electroactive group with formula $NAr^1Ar^2Ar^3$ wherein $Ar^1$, $Ar^2$ and $Ar^3$ independently are $C_6$-$C_{50}$ aromatic substituents, and (c) a linker group connecting the polymerizable group and the electroactive group.

10 Claims, No Drawings

QUANTUM DOT LIGHT EMITTING DEVICES

FIELD OF THE DISCLOSURE

The present disclosure relates to an electronic device, especially, a quantum dot light emitting diode.

INTRODUCTION

Quantum dot light emitting diodes (QLEDs) are electroluminescent devices that employ multiple organic and inorganic layers in combination with an emissive layer of semiconductor nanoparticle, sometimes referred to as quantum dots (QDs). The quantum dot layer in the QLED is capable of emitting light when an electrical input is applied to the device. Consequently, QLEDs can be used as light sources in display and general lighting applications. One limitation of QLEDs is the lack of suitable hole-transport layers (HTLs) capable of efficient charge injection into the quantum dot layers. Poor charge injection into the quantum dot results in QLED devices with high operating voltages and low light generation efficiency.

Therefore, there is a continuing desire for new hole-transport materials to enable improved QLED devices with high brightness and color purity, minimized power consumption, and high reliability.

SUMMARY OF THE DISCLOSURE

The present invention provides a quantum dot light emitting diode comprising i) an emitting layer of at least one semiconductor nanoparticle made from semiconductor materials selected from the group consisting of Group II-VI compounds, Group II-V compounds, Group III-VI compounds, Group III-V compounds, Group IV-VI compounds, Group compounds, Group II-IV-VI compounds, Group II-IV-V compounds, or any combination thereof; and ii) a polymer for hole injection or hole transport layer; and the polymer comprises, as polymerized units, at least one or more monomers having a first monomer structure comprising a) a polymerizable group, b) an electroactive group with formula $NAr^1Ar^2Ar^3$ wherein $Ar^1$, $Ar^2$ and $Ar^3$ independently are $C_6$-$C_{50}$ aromatic substituents, and (c) a linker group connecting the polymerizable group and the electroactive group.

DETAILED DESCRIPTION OF THE DISCLOSURE

The quantum dot light emitting device of the present invention comprises an anode layer, optionally one or more hole injection layers, one or more hole transport layers, optionally one or more electron blocking layers, an emitting layer, optionally one or more hole blocking layers, optionally one or more electron transport layers, optionally one or an more electron injection layers, and a cathode.

The light emissive layer comprises at least one semiconductor nanoparticle.

Either the hole injection layer, or the hole transport layer, or both of the hole injection layer and the hole transport layer, or a layer that functions as either/both a hole injection layer or/and a hole transport layer, comprise(s) a polymer of the following descriptions.

Light Emissive Layer

The light emissive layer of the QLED comprises semiconductor nanoparticles. In some embodiments, the semiconductor nanoparticle may comprise an elemental, binary, ternary, or quaternary semiconductor. The semiconductor can comprise 5 or more elements if desired. In some embodiments, the composition of the semiconductor nanoparticle may include Group IV compounds, Group II-VI compounds, Group II-V compounds, Group III-VI compounds, Group III-V compounds, Group IV-VI compounds, Group compounds, Group II-IV-VI compounds, Group II-IV-V compounds, or any combination thereof. In some embodiments, the composition of the semiconductor nanoparticles may include metal oxides such as ZnO and $TiO_2$. In some embodiments, the composition of the semiconductor nanoparticles may include perovskite materials such as methylammonium lead trihalides. In some embodiments, the semiconductor nanoparticles may include CdS, CdSe, CdTe, ZnS, ZnSe, ZnTe, InP, $CuInSe_2$, or any combination thereof. In some embodiments, the semiconductor nanoparticles may include a heterojunction. In some embodiments, the semiconductor nanoparticles may comprise a graded composition whereby the composition transitions from a first composition to a second composition over a distance.

The semiconductor nanoparticles can be undoped; or doped with rare earth elements, such as Eu, Er, Tb, Tm, Dy; and/or transition metal elements, such as Mn, Cu, and Ag; or any combination thereof.

In some embodiments, the semiconductor nanoparticles have at least one dimension 100 nanometers or less in length, 50 nanometers or less in length, or even 20 nanometers or less in length. In some embodiments, the size of the semiconductor nanoparticles in the light emission layer may have a distribution. In some embodiments, the size distribution of the semiconductor nanoparticles may be unimodal or multimodal. In some embodiments, the semiconductor nanoparticles have isotropic dimensionality or non-isotropic dimensionality.

In some embodiments, the semiconductor nanoparticles can have a core-shell structure whereby an additional material (known as a "shell") is coated on the outside of an inner portion of the semiconductor nanoparticle. The shell may be composed of a semiconductor or an insulator. In some embodiments, the composition of the shell may include Group IV compounds, Group II-VI compounds, Group II-V compounds, Group III-VI compounds, Group III-V compounds, Group IV-VI compounds, Group compounds, Group II-IV-VI compounds, Group II-IV-V compounds, or any combination thereof. In another embodiments, the composition of the shell may include metal oxides such as ZnO and $TiO_2$. In another embodiment, the composition of the shell may include perovskite materials such as methylammonium lead trihalides. In some embodiments, the composition of the shell may include CdS, CdSe, CdTe, ZnS, ZnSe, ZnTe, InP, $CuInSe_2$, or any combination thereof. In some embodiments, the shell may comprise a single layer or multiple layers. In some embodiments, the shell may comprise a graded composition whereby the composition transitions from a first composition to a second composition over a distance. In some embodiments, the composition may be continuously graded from the inner portion of the semiconductor nanoparticle to the shell. In some embodiments, the shell can have a thickness of 100 nanometers or less, 50 nanometers or less, or even 5 nanometers or less.

The surface of the semiconductor nanoparticles may be populated with molecules, sometimes referred to as ligands, such as alkylphosphines, alkylphosphine oxides, amines, carboxylic acids, and the like and/or endcapping inorganic molecules to allow for the dispersion in a variety of solvents and to control aggregation and coalescence between nanoparticles.

The ligand molecules may be covalently or non-covalently attached to the quantum dots through functional groups capable of making a covalent or non-covalent interaction with the outermost layer of the quantum dot. In some embodiments the functional group may be selected from a list including, but not limited to, phosphines, phosphine oxides, carboxylic acids, amines, and alcohols. In some embodiments, a second functional group may be present on the ligand, such that the first functional group interacts with the quantum dot surface and the second functional group interacts with the ligands on adjacent quantum dot.

In some embodiments, the functional group on the ligand molecule may have an organic substituent such as, but not limited to, saturated alkyl groups, unsaturated alkyl groups, aromatic groups, linear alkyl groups, non-linear alkyl groups, branched alkyl groups, ether groups, or amine groups. In some embodiments the ligand layer may consist of a mixture of one or more types of molecules. The ligand layer may have any desired thickness according to the embodiments of the present invention. In some embodiments the ligand layer has a thickness of 15 nanometers or less, or 10 nanometers or less, or even 3 nanometers or less. In some embodiments the ligand molecules form a complete monolayer or a sub-monolayer on the surface of the quantum dot.

In some embodiments, the semiconductor nanoparticle can be one-dimensional. The one-dimensional nanoparticles have cross-sectional areas whose characteristic thickness dimension (e.g., the diameter for a circular cross-sectional area or a diagonal for a square or rectangular cross-sectional area) are 1 nm to 1000 nanometers (nm), preferably 2 nm to 50 nm, and more preferably 5 nm to 20 nm (such as about 6, 7, 8, 9, 10, 11, 12, 13, 14, 15, 16, 17, 18, 19, or 20 nm) in diameter. Nanorods are rigid rods that have circular cross-sectional areas whose characteristic dimensions lie within the aforementioned ranges. Nanowires or nanowhiskers are curvaceous and have different serpentine or vermicular shapes. Nanoribbons have cross-sectional areas that are bounded by four or five linear sides. Examples of such cross-sectional areas are square, rectangular, parallelepipeds, rhombohedrals, and the like. Nanotubes have a substantially concentric hole that traverses the entire length of the nanorod, thereby causing it to be tube-like. The aspect ratios of these one-dimensional nanoparticles are greater than or equal to 2, preferably greater than or equal to 5, and more preferably greater than or equal to 10.

The one-dimensional nanoparticles have a length of 10 to 100 nanometers, preferably 12 to 50 nanometers and more preferably 14 to 30 nanometers. The one-dimensional nanoparticle can have a diameter of 2 to 10 nanometers, preferably 3 to 7 nanometers. The one-dimensional nanoparticles have an aspect ratio that is greater than or equal to about 2, preferably greater than or equal to about 4.

In one exemplary embodiment, the semiconductor nanoparticles comprise a one-dimensional nanoparticle that has disposed at either or each end a single endcap or a plurality of endcaps that contact the one-dimensional nanoparticle. In one embodiment, the endcaps also contact each other. The endcaps serve to passivate the one-dimensional nanoparticles. The nanoparticles can be symmetrical or asymmetrical about at least one axis. The nanoparticles can be asymmetrical in composition, composition of the endcap, in geometric structure and electronic structure, or in both composition and structure.

In one embodiment, the nanoparticle comprises a one-dimensional nanoparticle that comprises an endcap at each opposing end along its longitudinal axis. Each endcap has a different composition, thus providing the nanoparticle with multiple heterojunctions. In another embodiment, the nanoparticle comprises a one-dimensional nanoparticle that comprises an endcap at each opposing end along its longitudinal axis and further comprises nodes disposed on a radial surface of the one-dimensional nanoparticle or on the endcaps. The radial surface is also termed the lateral surface of the rods. The endcaps can have similar or different compositions from each other and/or the nodes can have similar or different compositions from each other so long as one of the endcaps has a different composition from either the other endcap or from at least one of the nodes.

In one embodiment, the plurality of endcaps comprises a first endcap and a second endcap that partially or completely encircles the first endcap. The endcaps are three dimensional nanoparticles, at least one of which directly contacts the one-dimensional nanoparticle. Each endcap may or may not contact the one-dimensional nanoparticle. The first endcap and the second endcap can have different compositions from each other. The nodes are also three dimensional nanoparticles that can be smaller or larger in size than the endcaps.

The term "heterojunction" implies structures that have one semiconductor material in direct contact with another semiconductor material.

The one-dimensional nanoparticle, the first endcap and the second endcap each comprises semiconductors. The interface between the nanorods and the first endcap provides a first heterojunction, while the interface between the first endcap and the second endcap provides a second heterojunction. In this manner the nanoparticles may comprise a plurality of heterojunctions.

In one embodiment, the heterojunction at which the one dimensional nanoparticle contacts the first endcap has a type I or quasi-type II band alignment. In another embodiment, the point at which the second endcap contacts the first endcap has a type I or quasi-type II band alignment.

The first endcap and the second endcap are chemically different from each other and are selected from the group consisting of Si, Ge, Pb, SiGe, ZnO, $TiO_2$, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or the like, or a combination comprising at least one of the foregoing semiconductors. In an exemplary embodiment, the first endcap is CdTe or CdSe, while the second endcap is ZnSe.

By changing the composition and size (diameter or length) of the one-dimensional nanoparticle, the first endcap and/or the second endcap, the energy band gap and band offsets can be varied. Varying the energy band gap can be used to change wavelength, the efficiency and intensity of light generation in the nanoparticles. In one embodiment, the conduction band offset between the first endcap and the one dimensional nanoparticle is much higher than the conduction band offset between the first endcap and the second endcap, and where the valence band offset between the first endcap and the one-dimensional nanoparticle is much lower than one between the first endcap and the second endcap. In another embodiment, the conduction band offset between the first endcap and one-dimensional nanoparticle is much lower than one between the first endcap and the second endcap, and where the valence band offset between the first endcap and one-dimensional nanoparticle is much lower than one between the first endcap and the second endcap. In yet another embodiment, one of two heterojunctions that are formed by the first endcap has a smaller conduction band offset and a larger valence band offset than others, and the other has larger conduction band offset and smaller valence band offset.

In one embodiment, the nanoparticles comprise two types of heterojunctions where the type II staggered band offset allows for the efficient injection of electrons and holes, while the type I offset defines a recombination center for highly efficient light emission.

In one embodiment the nanoparticles may be used to form layers or films. In one embodiment, the layers may be disordered. In another embodiment, the layers may have liquid crystalline character. In another embodiment, the layers may contain ordering in a single dimension. In another embodiment, the layers may contain ordering in two dimensions, or in three dimensions. In another embodiment, the nanoparticles may self-assemble into lattices within the film.

In some embodiments, anisotropic nanoparticles may be aligned in the layers within a device. In one embodiment the anisotropic nanoparticles may be aligned such that the one-dimensional axis of the particle is normal to the surface of the layer. In another embodiment, the anisotropic nanoparticles may be aligned within the plan of the layer. In another embodiment, the anisotropic particles may be aligned such that a plurality of the anisotropic particles one dimensional axes are aligned in the same direction.

Polymer for Hole Injection/Transport Layer

In one exemplary embodiment, the polymer comprises, as polymerized units, at least one or more monomers having a first monomer structure comprising a) a polymerizable group, b) an electroactive group with formula $NAr^1Ar^2Ar^3$ wherein $Ar^1$, $Ar^2$ and $Ar^3$ independently are $C_6$-$C_{50}$ aromatic substituents, and (c) a linker group connecting the polymerizable group and the electroactive group.

In another embodiment, the polymer additionally comprises at least one or more monomers having a second monomer structure.

The polymer has an Mw of at least 5,000, preferably at least 10,000, preferably at least 20,000; preferably no greater than 10,000,000, preferably no greater than 1,000,000, preferably no greater than 500,000, preferably no greater than 400,000, preferably no greater than 300,000, preferably no greater than 200,000, preferably no greater than 100,000. Preferably, the polymer comprises at least 50% (preferably at least 60%, preferably at least 70%, preferably at least 80%, preferably at least 90%) electroactive groups which contain at least five aromatic rings, preferably at least six, preferably no more than 20, preferably no more than 15; other monomers not having this characteristic may also be present. A cyclic moiety which contains two or more fused rings is considered to be a single aromatic ring, provided that all ring atoms in the cyclic moiety are part of the aromatic system. For example, naphthyl, carbazolyl and indolyl are considered to be single aromatic rings, but fluorenyl is considered to contain two aromatic rings because the carbon atom at the 9-position of fluorene is not part of the aromatic system. Preferably, the polymer comprises at least 50% (preferably at least 70%) electroactive groups which contain at least one of triarylamine, carbazole, indole, bi-phenyl and fluorene ring systems.

The polymerizable group of the present invention may be selected from an ethenyl group (preferably attached to an aromatic ring), benzocyclobutenes, acrylate or methacrylate groups, trifluorovinylether, cinnamate/chalcone, diene, ethoxyethyne and 3-ethoxy-4-methylcyclobut-2-enone. Preferred polymerizable groups comprise of at least one of the following structures.

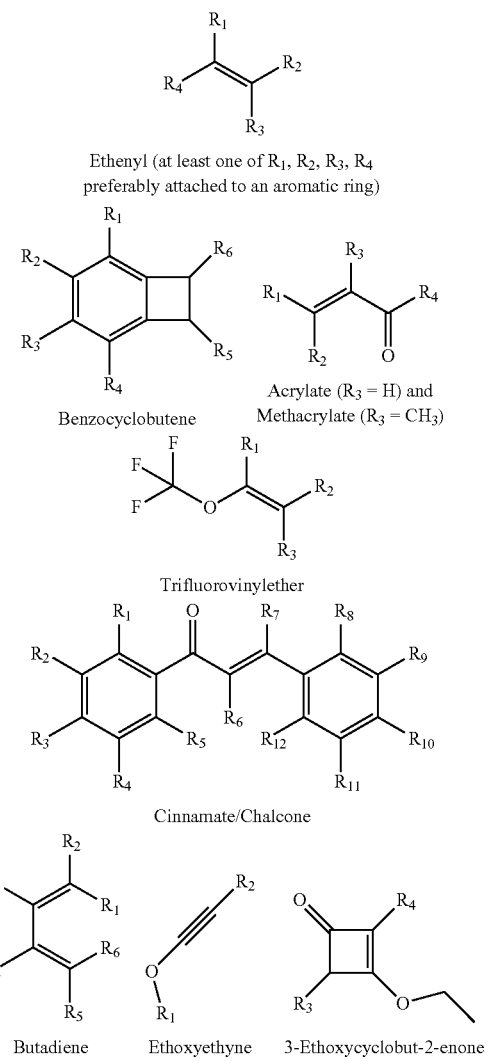

where "$R_1$ to $R_{12}$" groups independently are hydrogen, deuterium, $C_1$-$C_{30}$ alkyl, hetero-atom substituted $C_1$-$C_{30}$ alkyl, $C_1$-$C_{30}$ aryl, hetero-atom substituted $C_1$-$C_{30}$ aryl or represent another part of the resin structure; preferably hydrogen, deuterium, $C_1$-$C_{20}$ alkyl, hetero-atom substituted $C_1$-$C_{20}$ alkyl, $C_1$-$C_{20}$ aryl, hetero-atom substituted $C_1$-$C_{20}$ aryl or represent another part of the resin structure; preferably hydrogen, deuterium, $C_1$-$C_{10}$ alkyl, hetero-atom substituted $C_1$-$C_{10}$ alkyl, $C_1$-$C_{10}$ aryl, hetero-atom substituted $C_1$-$C_{10}$ aryl or represent another part of the resin structure; preferably hydrogen, deuterium, $C_1$-$C_4$ alkyl, hetero-atom substituted $C_1$-$C_4$ alkyl, or represent another part of the resin structure. In one preferred embodiment of the invention, "$R_1$ to $R_{12}$" groups may be connected to form fused ring structures.

In yet another embodiment, examples of the polymerizable group include:

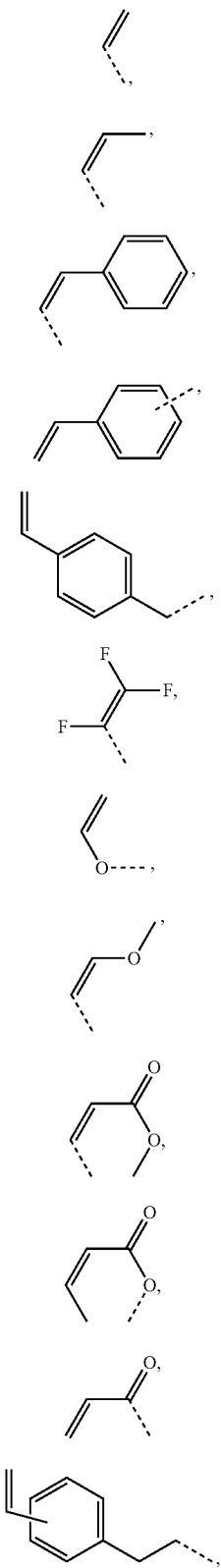

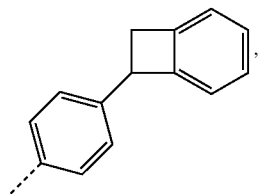

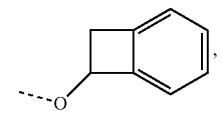

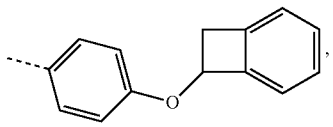

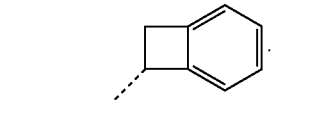

Preferably, the polymerizable group is selected from

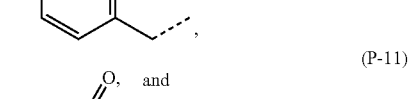

In one embodiment, the electroactive group of the present invention has a formula $NAr^1Ar^2Ar^3$, wherein $Ar^1$, $Ar^2$ and $Ar^3$ independently are $C_6$-$C_{50}$ aromatic substituents.

Suitable examples of $Ar^1$ to $Ar^3$ include

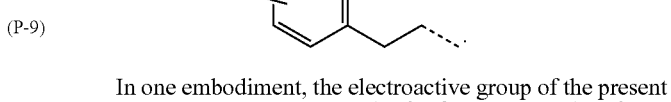
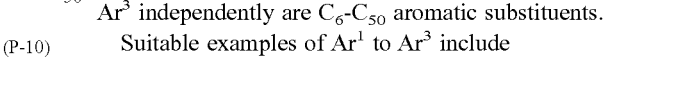
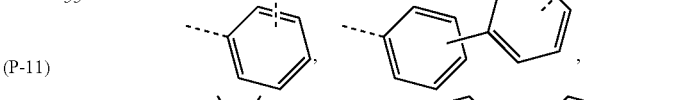
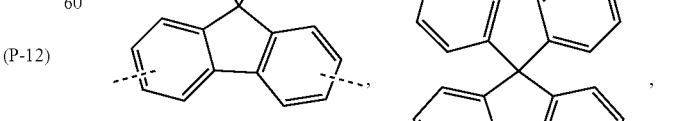
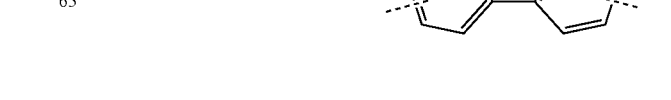

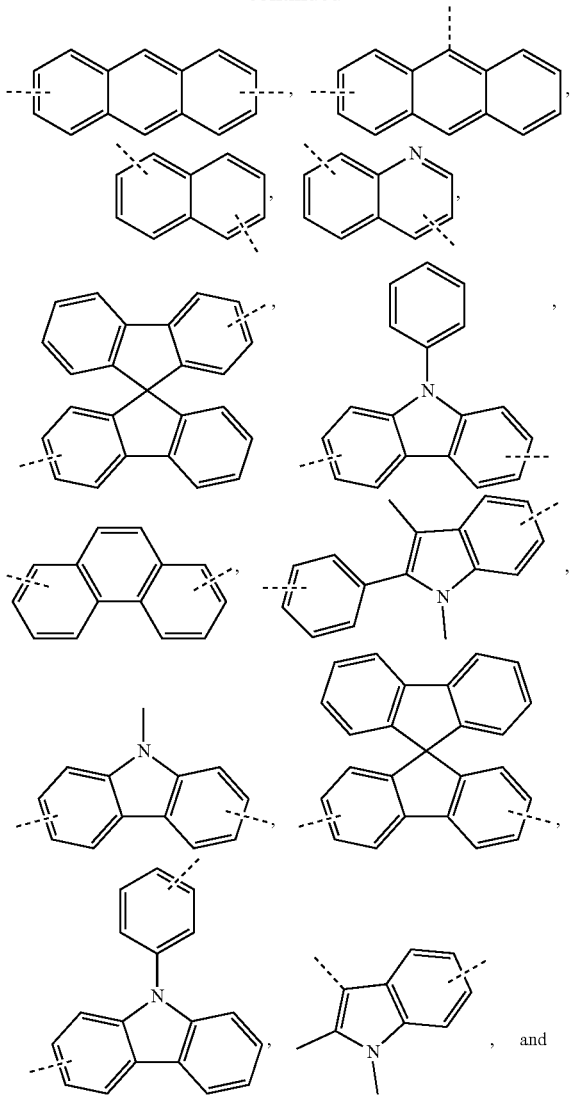

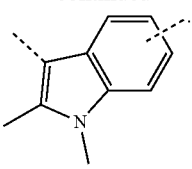

Preferably, the electroactive group of formula NAr¹Ar²Ar³ contains a total of 4 to 20 aromatic rings; preferably at least 5, preferably at least 6; preferably no more than 18, preferably no more than 15, preferably no more than 13. Preferably, each of Ar¹, Ar² and Ar³ independently contains at least 10 carbon atoms, preferably at least 12; preferably no more than 45, preferably no more than 42, preferably no more than 40. In a preferred embodiment, each of Ar² and Ar³ independently contains at least 10 carbon atoms, preferably at least 15, preferably at least 20; preferably no more than 45, preferably no more than 42, preferably no more than 40; and Ar¹ contains no more than 35 carbon atoms, preferably no more than 25, preferably no more than 15. Aliphatic carbon atoms, e.g., $C_1$-$C_6$ hydrocarbyl substituents or non-aromatic ring carbon atoms (e.g., the 9-carbon of fluorene), are included in the total number of carbon atoms in an Ar substituent. Ar groups may contain heteroatoms, preferably N, O or S; preferably N; preferably Ar groups contain no heteroatoms other than nitrogen. Preferably, only one linker group is present in the compound of formula NAr¹Ar²Ar³. Preferably, Ar groups comprise one or more of biphenylyl, fluorenyl, phenylenyl, carbazolyl and indolyl.

When one nitrogen atom in one of the Ar substituents is a triarylamine nitrogen atom, the Ar¹, Ar² and Ar³ groups can be defined in different ways depending on which nitrogen atom is considered to be the nitrogen atom in the formula NAr¹Ar²Ar³. In this case, the nitrogen atom and Ar groups are to be construed so as to satisfy the claim limitations.

Preferably, Ar¹, Ar² and Ar³ collectively contain no more than five nitrogen atoms, preferably no more than four, preferably no more than three.

Suitable examples of the electroactive group having formula NAr¹Ar²Ar³ contain the followings:

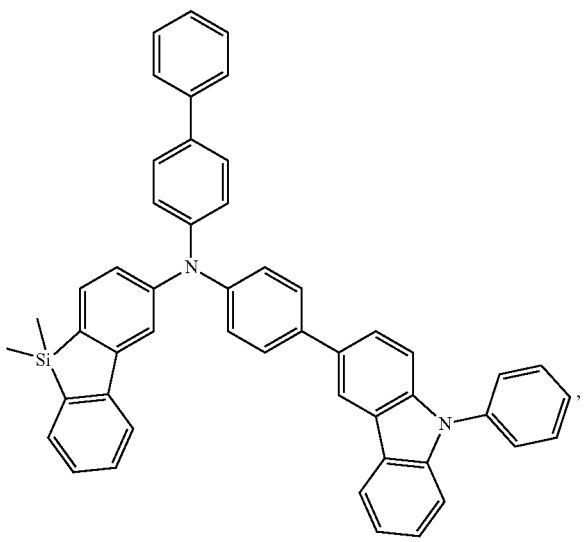

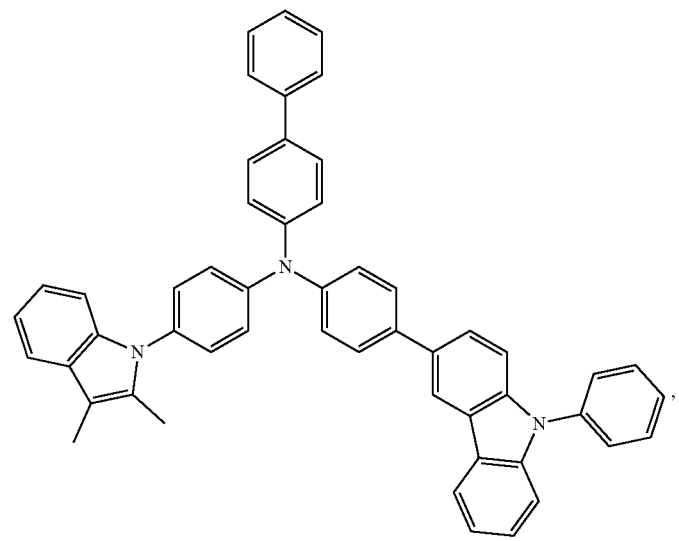
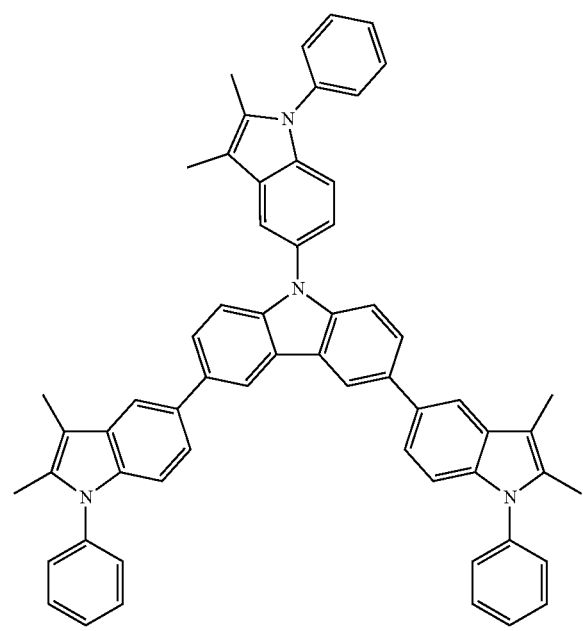
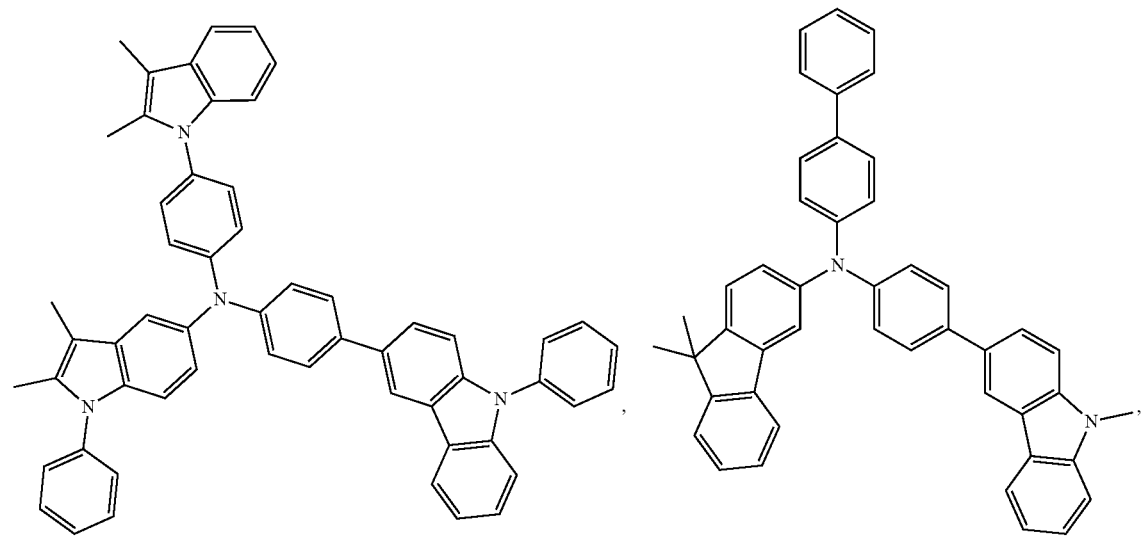

-continued
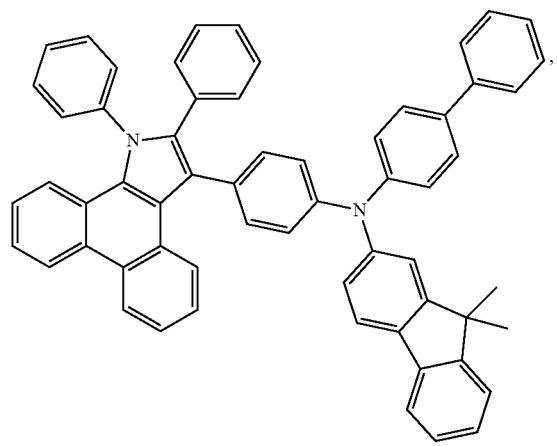
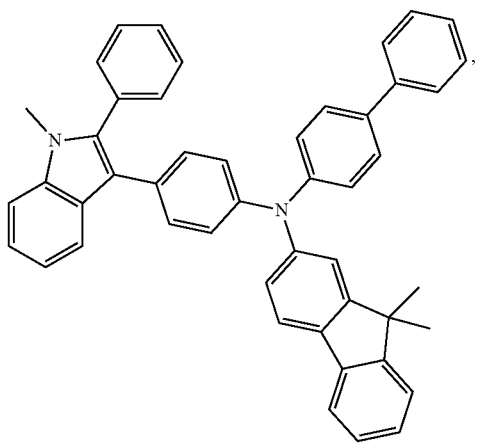
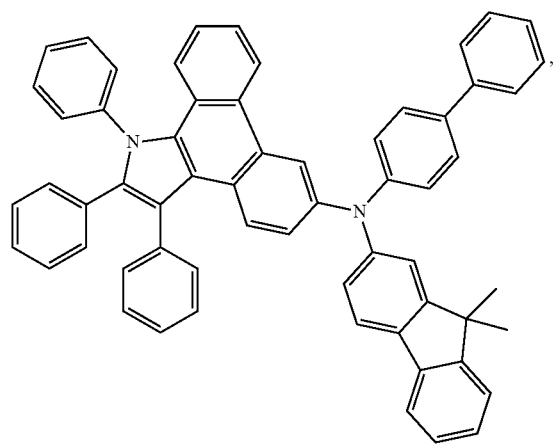
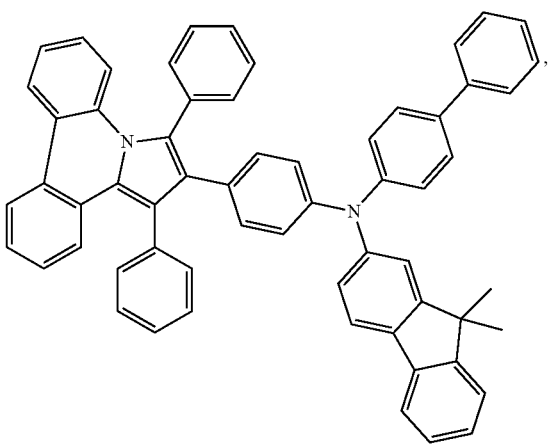
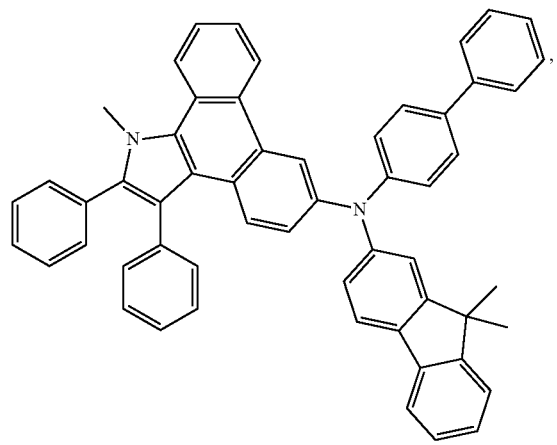
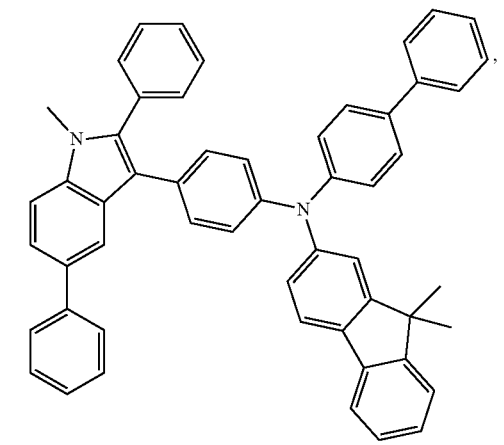

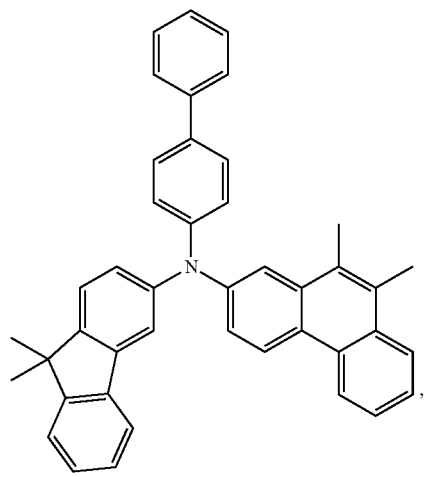
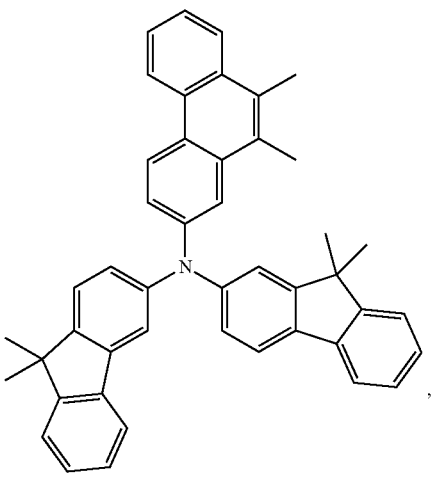
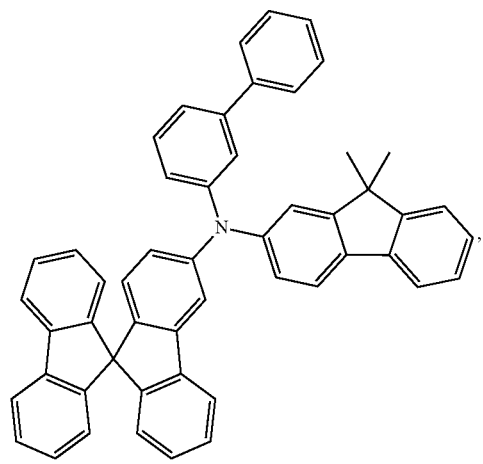
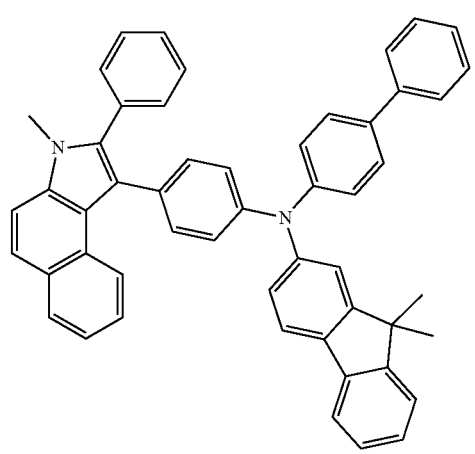
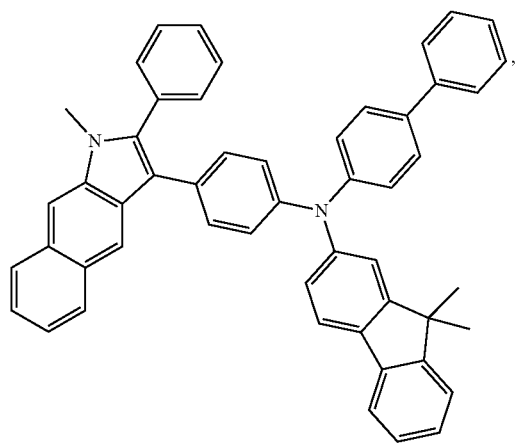
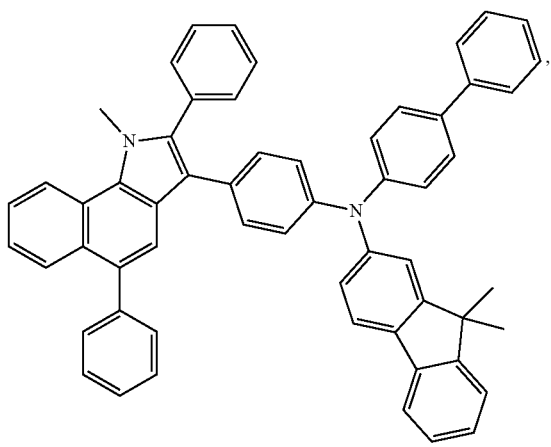

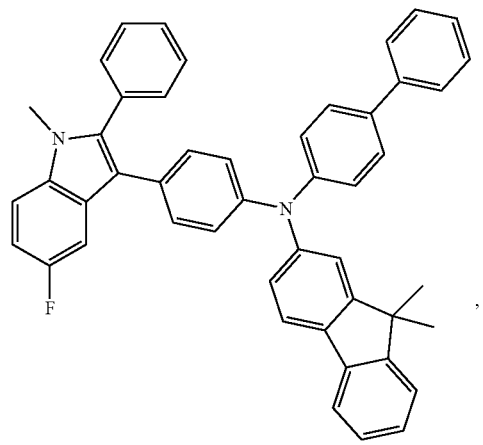
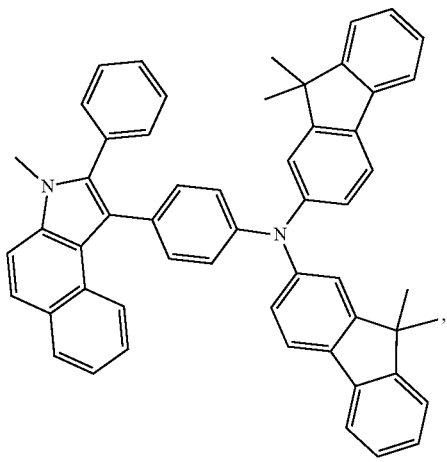
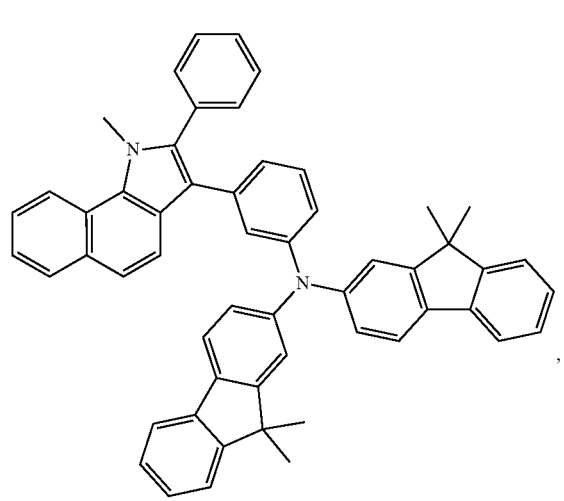
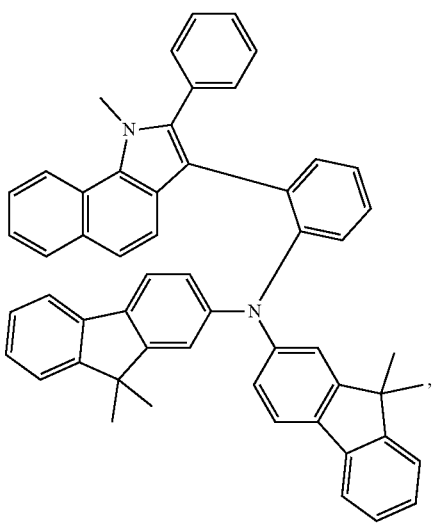
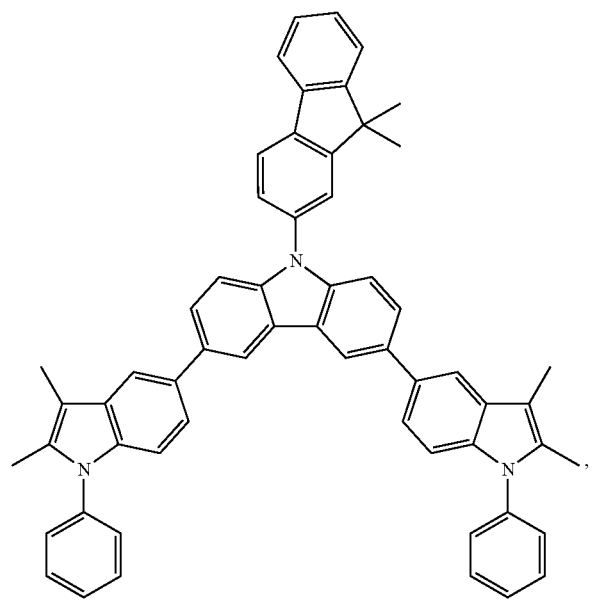

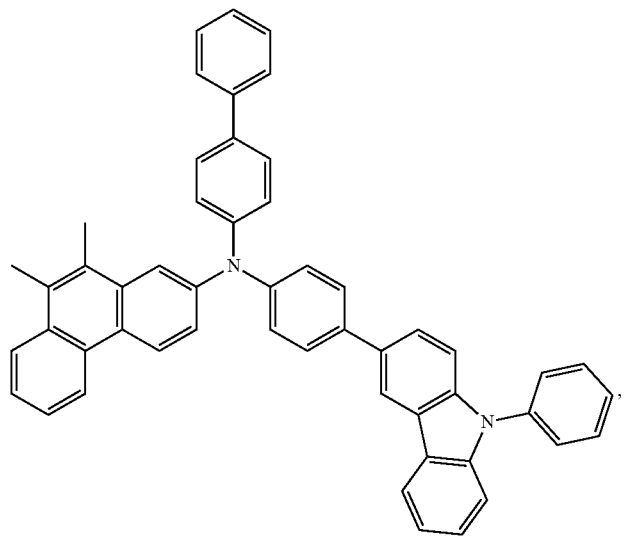
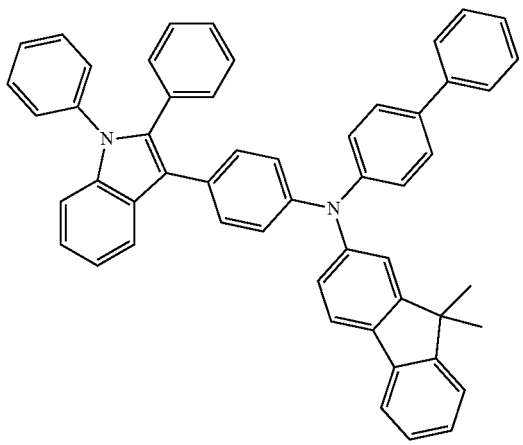
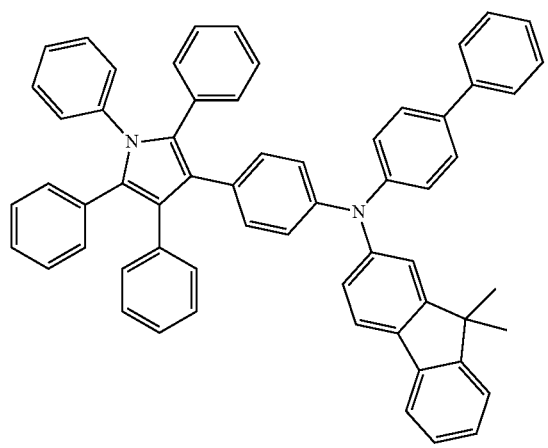
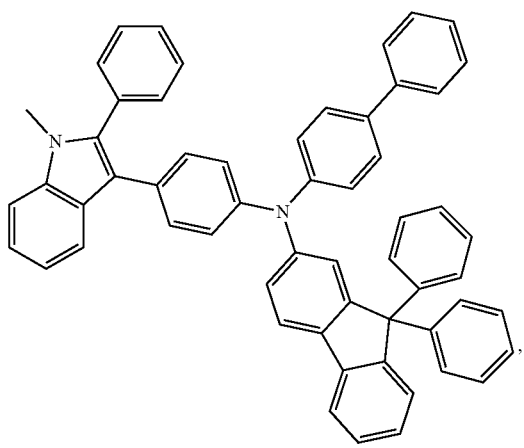
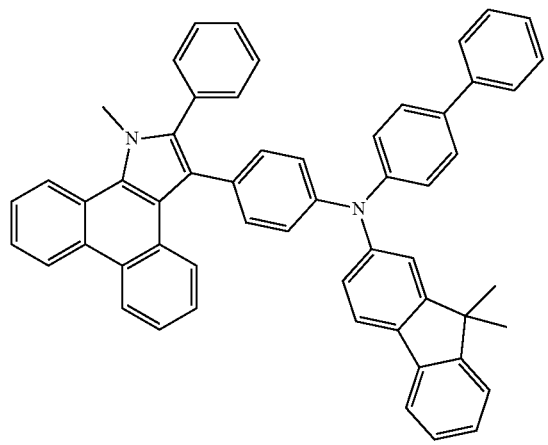
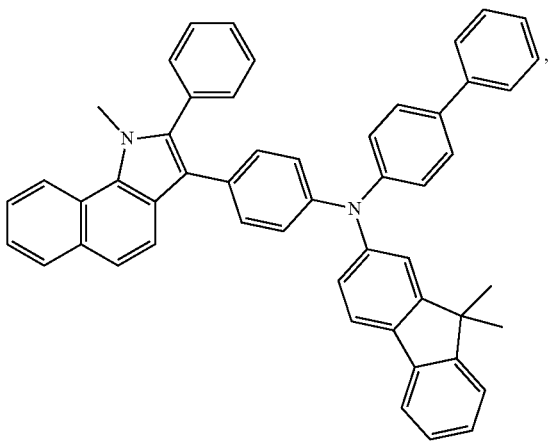

-continued
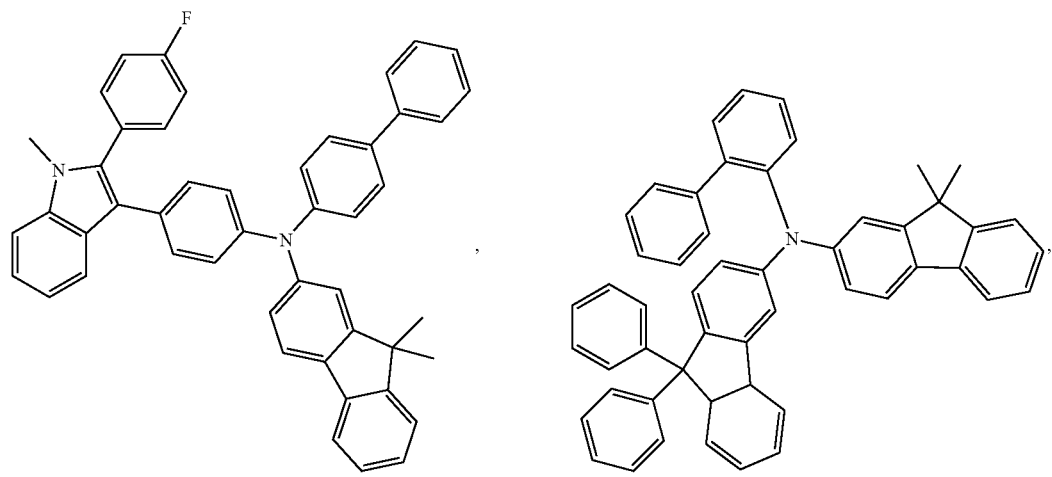
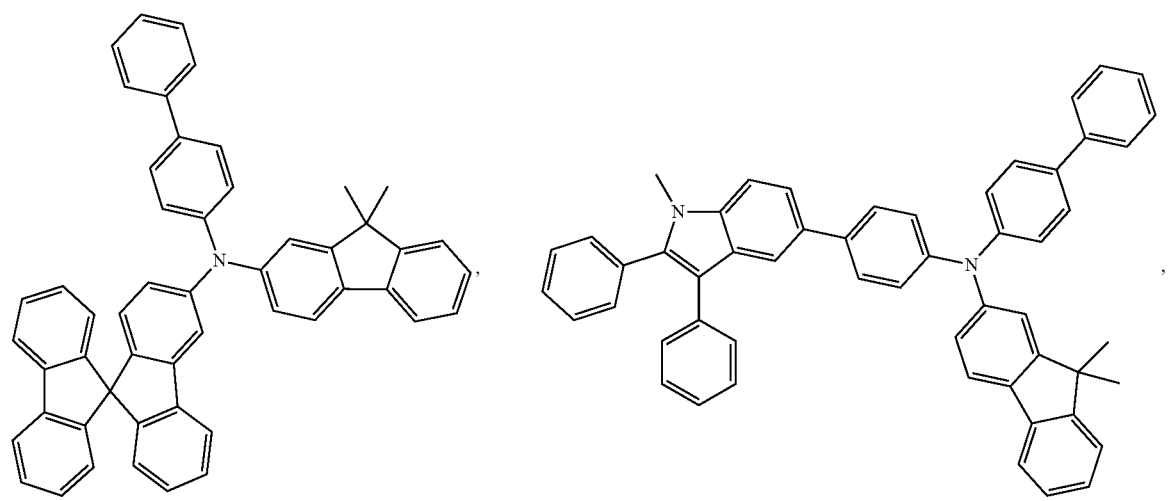
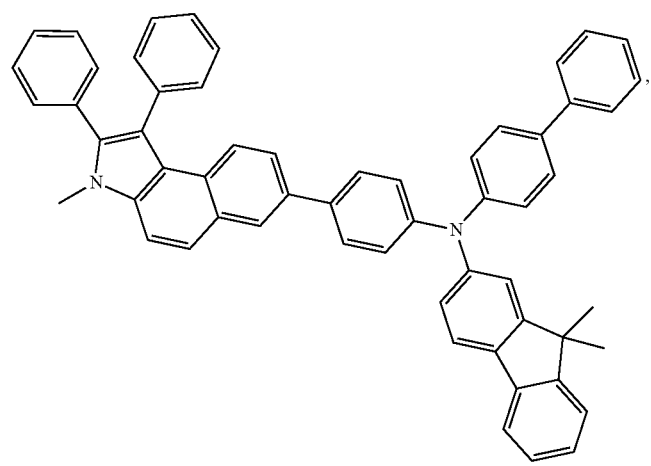

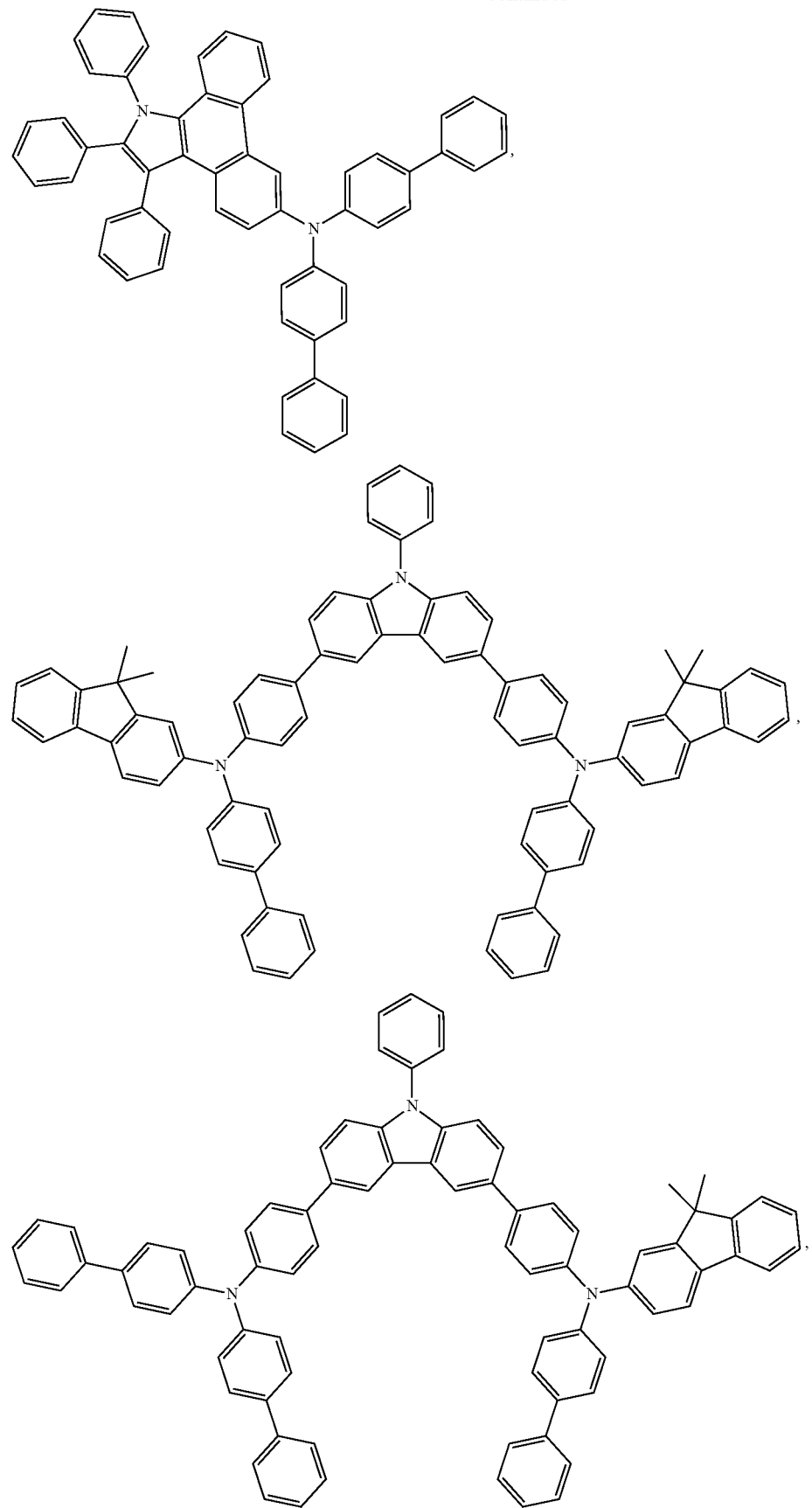

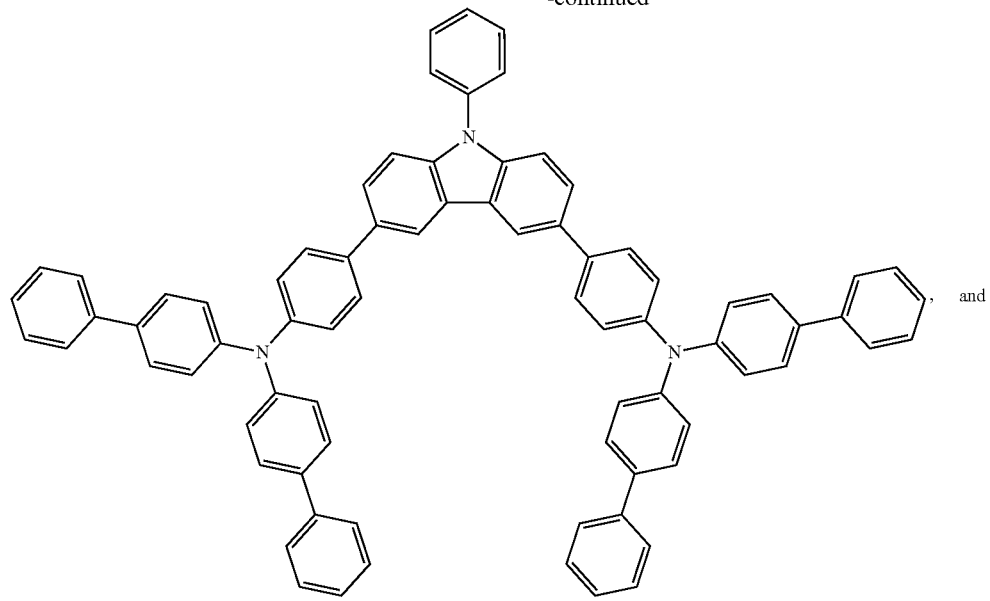
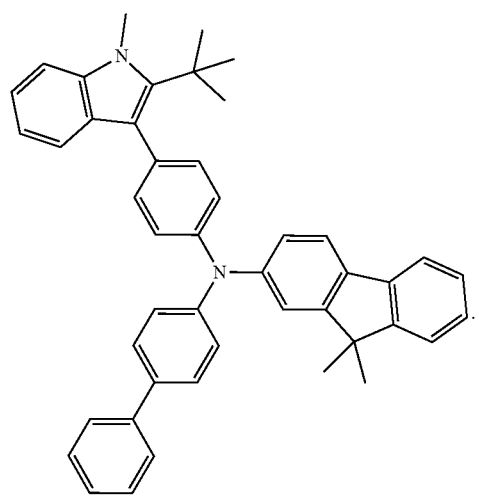
In another embodiment, the polymer comprises a second monomer selected from the following list.
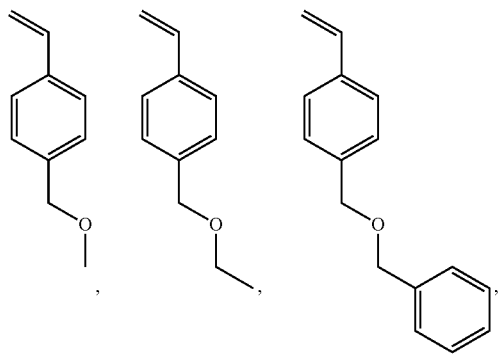
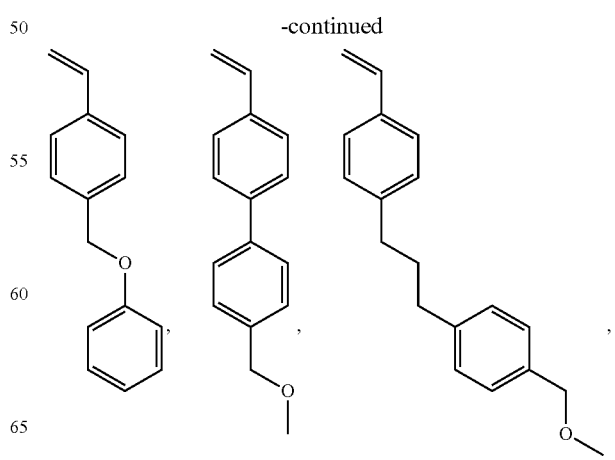

27
-continued
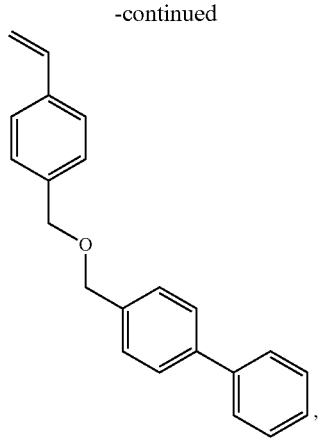
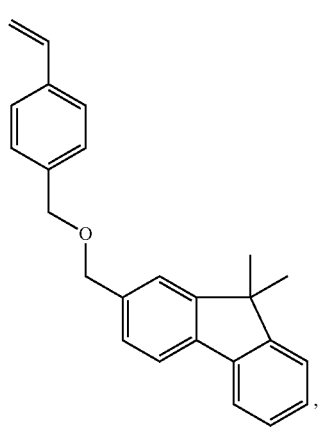
28
-continued
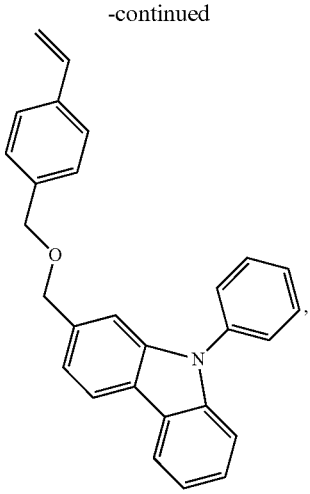
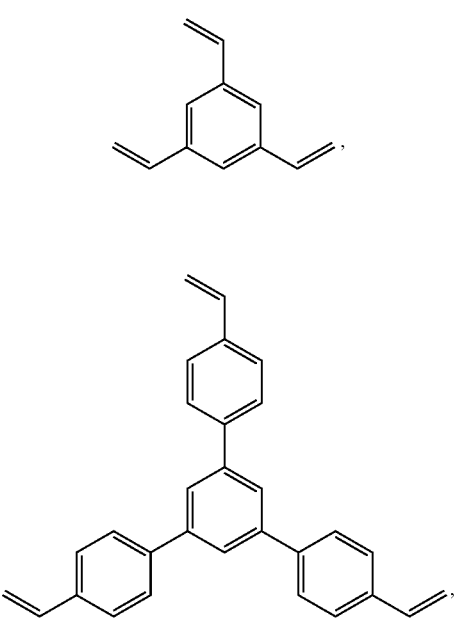

-continued
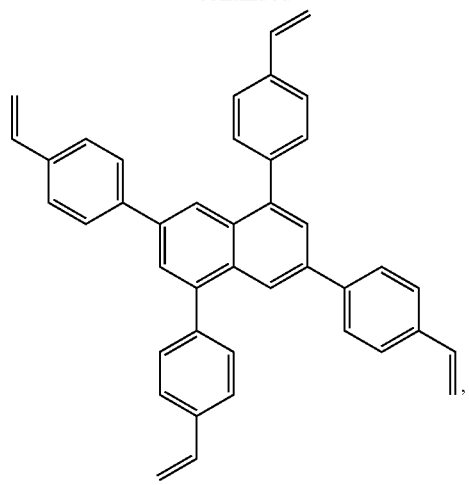
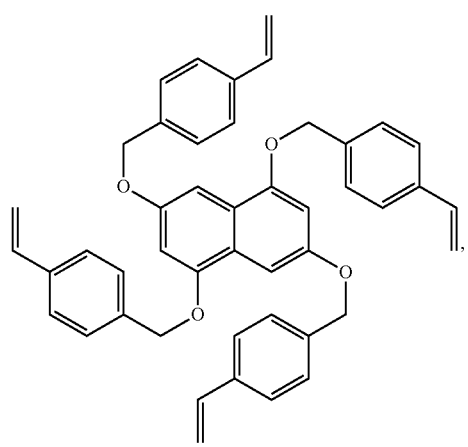
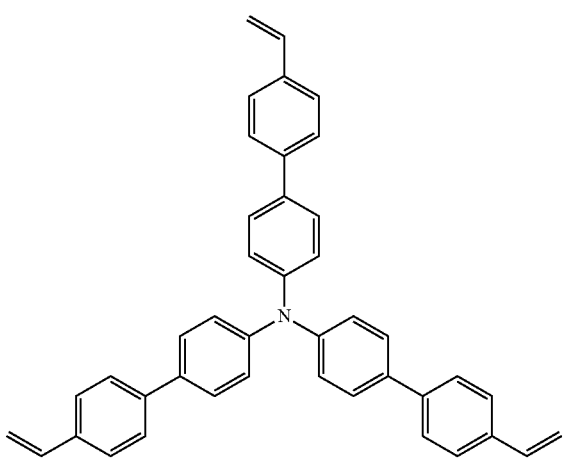
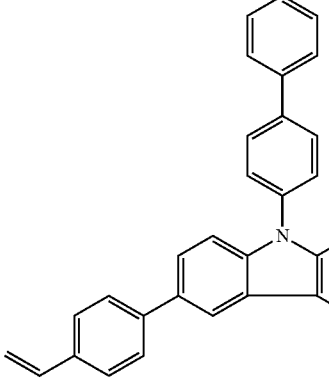
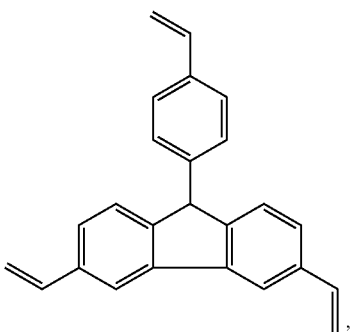
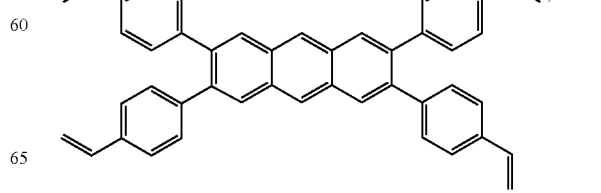

-continued

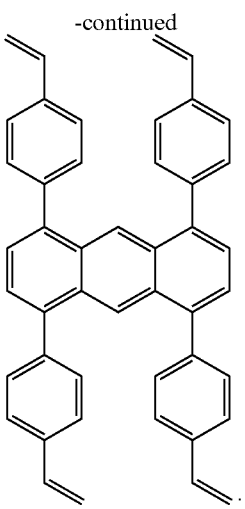

Preferably, the polymer comprises less than 50% of the second monomer, preferably less than 40%, preferably less than 30%, preferably less than 20%, preferably less than 10%.

The second monomer has an MW less than 5,000, preferably less than 3,000, preferably less than 2,000, and preferably less than 1,000.

The polymerizable group and the electroactive group of the present invention are connected through a linker group selected from the group consisting of a covalent bond; —O—; -alkylene-; -arylene-; -alkylene-arylene-; -arylene-alkylene-; —O-alkylene-; —O-arylene-; —O-alkylene-arylene-; —O-alkylene-O—; —O-alkylene-O-alkylene-O—; —O-arylene-O—; —O— alkylene-arylene-O—; —O—(CH$_2$CH$_2$—O)$_n$—, wherein n is an integer from 2 to 20; —O-alkylene-O-alkylene-; —O-alkylene-O-arylene-; —O-arylene-O—; —O-arylene-O-alkyene-; and —O-arylene-O-arylene.

In one embodiment, the linker group is an aryloxy linker, having at least one benzylic carbon atom attached to an oxygen atom. Preferably, the aryloxy linker is an ether, an ester or a benzyl alcohol. Preferably, the aryloxy linker has two benzylic carbon atoms attached to an oxygen atom. A benzylic carbon atom is a carbon atom which is not part of an aromatic ring and which is attached to a ring carbon of an aromatic ring having from 5 to 30 carbon atoms (preferably 5 to 20), preferably a benzene ring. In another embodiment, the linker group is an alkyl, an aryl, a heteroalkyl, a heteroaryl linker attached to ethenyl groups.

In one embodiment, the linker group comprises structures selected from the following list.

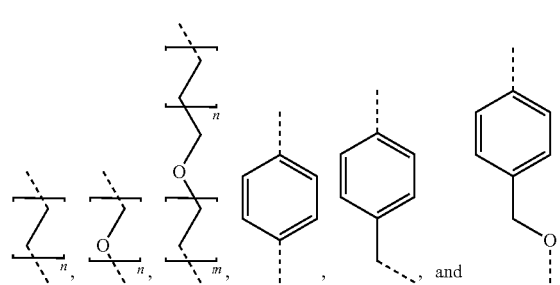

Optionally, the polymer may further comprise a p-dopant which may be an organic Bronsted acid with pKa ≤4; a Lewis acid comprising a positive aromatic ion and an anion; or a thermal acid generator (TAG) which is an ammonium or pyridinium salt of an organic Bronsted acid with pKa ≤2 or an ester of an organic sulfonic acid.

In one embodiment, the organic Bronsted acid has a pKa ≤2, preferably ≤0. Preferably, the organic Bronsted acid is an aromatic, alkyl or perfluoroalkyl sulfonic acid; a carboxylic acid; a protonated ether; or a compound of formula Ar$_4$SO$_3$CH$_2$Ar$_5$, wherein Ar$_4$ is phenyl, alkylphenyl or trifluoromethylphenyl, and Ar$_5$ is nitrophenyl.

In one embodiment, the positive aromatic ion has from seven to fifty carbon atoms, preferably seven to forty. In a preferred embodiment, the positive aromatic ion is tropylium ion or an ion having the formula

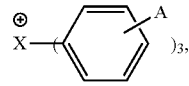

wherein A is a substituent on one or more of the aromatic rings and is H, D, CN, CF$_3$ or (Ph)$_3$C+(attached via Ph); X is C, Si, Ge or Sn. Preferably, X is C. Preferably, A is the same on all three rings.

In one embodiment, the anion is a tetraaryl borate having the formula

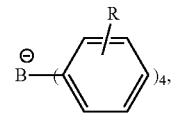

wherein R represents zero to five non-hydrogen substituents selected from F and CF$_3$. Preferably, R represents five substituents on each of four rings, preferably five fluoro substituents.

Preferably, the acid catalysts for use in the present invention includes a Bronsted acid, a Lewis acid or a TAG selected from the following list. In one embodiment, the TAG has a degradation temperature ≤280° C.

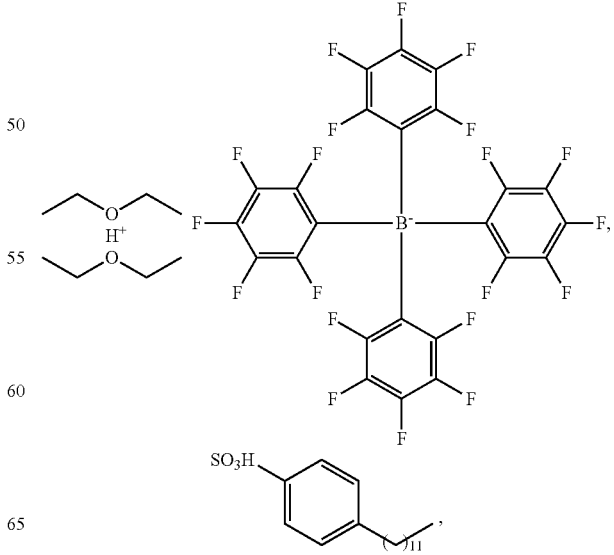

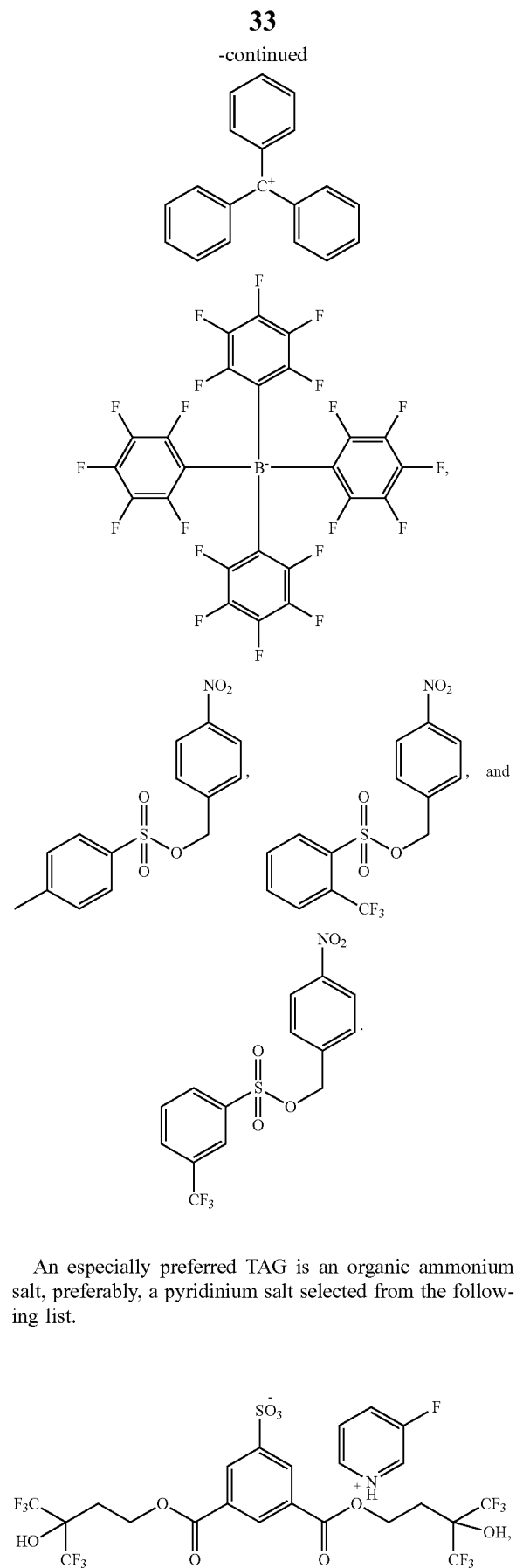

An especially preferred TAG is an organic ammonium salt, preferably, a pyridinium salt selected from the following list.

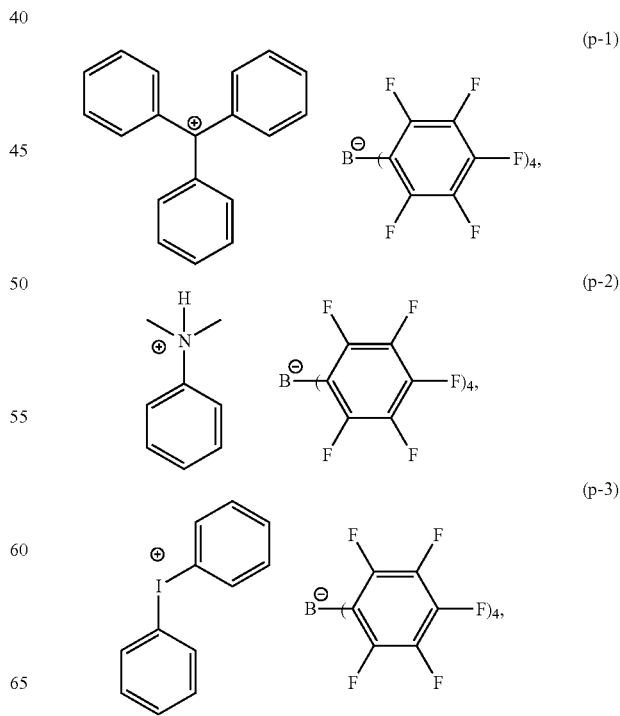

Optionally, the polymer may further be blended with one or more p-dopants selected from neutral and ionic compounds including trityl salts, ammonium salts, iodonium salts, tropylium salts, imidazolium salts, phosphonium salts, oxonium salts, and mixtures thereof. Preferably, the ionic compounds are selected from trityl borates, ammonium borates, iodonium borates, tropylium borates, imidazolium borates, phosphonium borates, oxonium borates, and mixtures thereof. Suitable examples of p-dopants used in the present disclosure include the following Compounds (p-1) through (p-15):

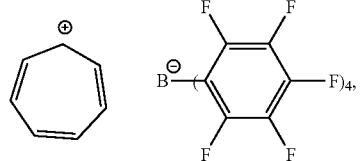
(p-4)
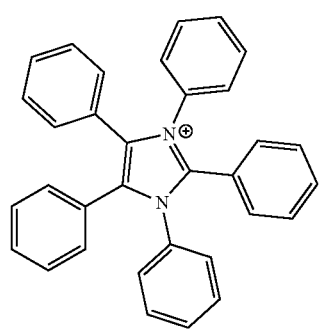
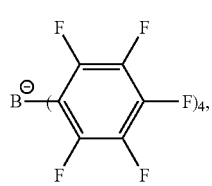
(p-5)
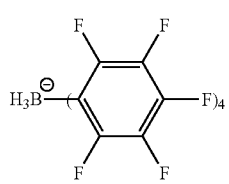
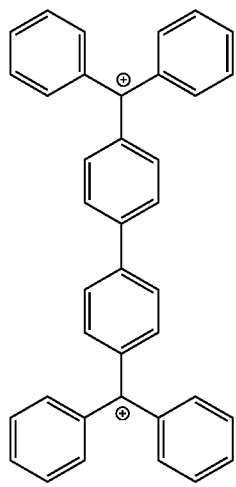
(p-6)
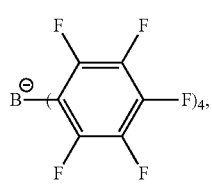
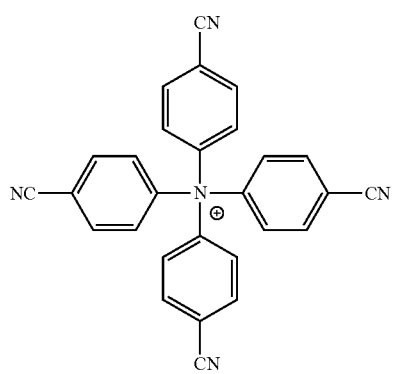
(p-7)
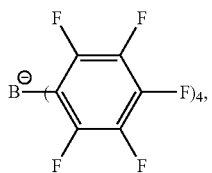
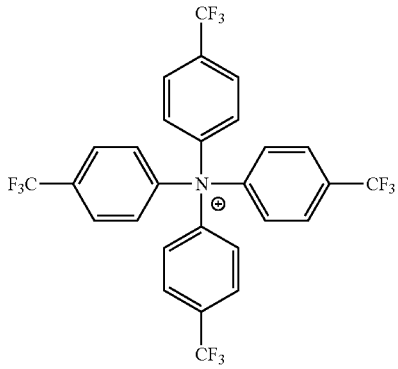
(p-8)
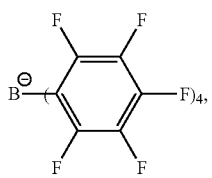
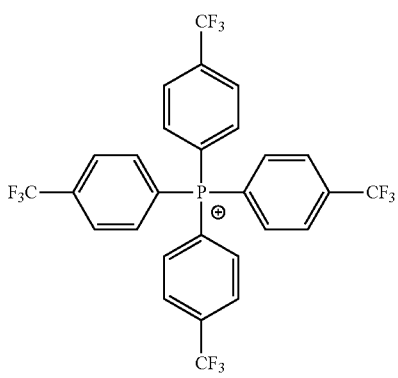
(p-9)
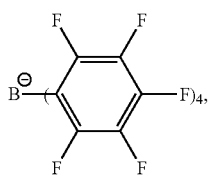
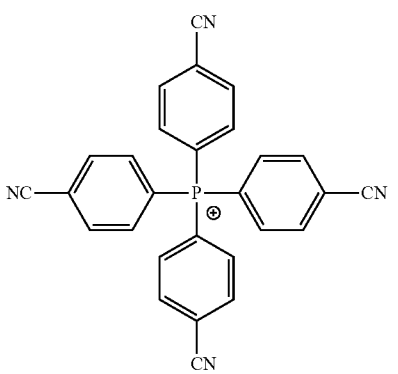
(p-10)

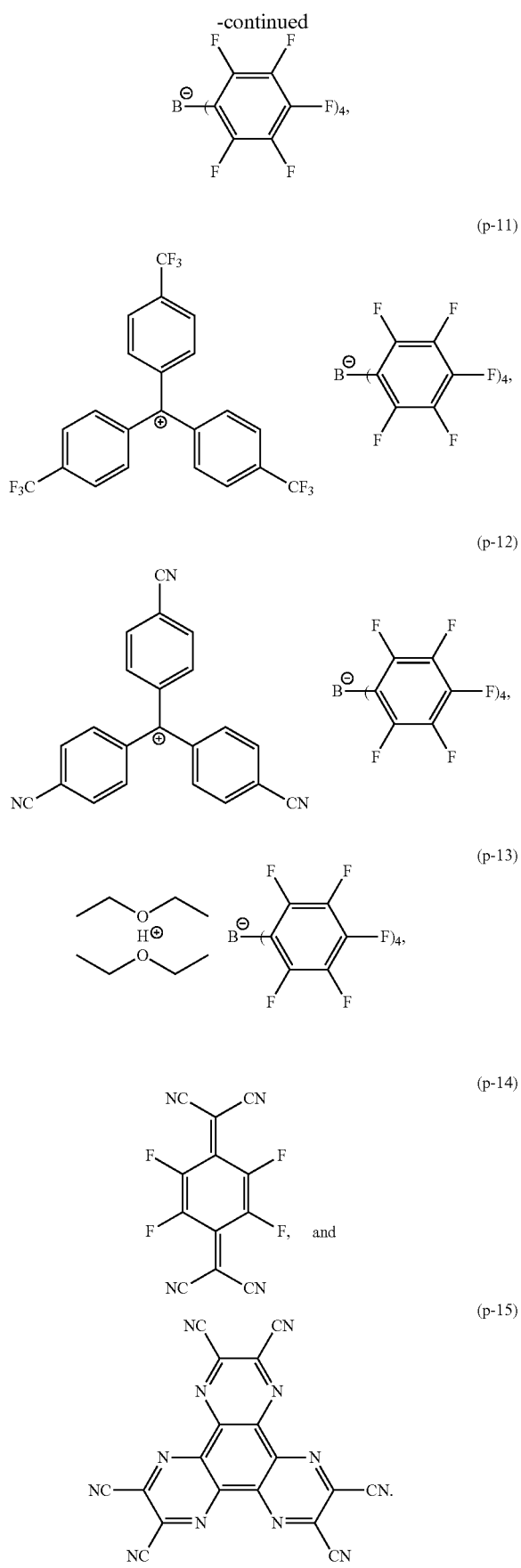

Preferably, the p-dopant is the following compound (p-1):

The p-dopant is present in the present disclosure at an amount of 1% by weight or more, 3% by weight or more, 5% by weight or more, or even 7% by weight or more, and at the same time, 20% by weight or less, 15% by weight or less, 12% by weight or less, or even 10% by weight or less, based on the total weight of the polymer.

Optionally, the p-dopant may be present as a separate layer. Without being limited by theory, the p-dopant may diffuse into the polymer following polymer deposition. Optionally, the diffusion of the p-dopant may be accelerated by a thermal treatment.

When a solution is made for coating the polymer on a substrate, preferably the solvent has a purity of at least 99.8% by weight, as measured by gas chromatography-mass spectrometry (GC/MS), preferably at least 99.9% by weight. Preferably, solvents have an RED value (relative energy difference (versus polymer) as calculated from Hansen solubility parameter using CHEMCOMP v2.8.50223.1) less than 1.2, more preferably less than 1.0. Preferred solvents include aromatic hydrocarbons and aromatic-aliphatic ethers, preferably those having from six to twenty carbon atoms. Anisole, mesitylene, xylene, and toluene are especially preferred solvents.

Preferably, the polymer of the present invention is present as a thin layer on a substrate. Preferably, the thickness of the polymer films produced according to this invention is from 1 nm to 100 microns, preferably at least 10 nm, preferably at least 30 nm, preferably no greater than 10 microns, preferably no greater than 1 micron, preferably no greater than 300 nm.

The polymer of the present invention may be deposited by any of various types of solution processing techniques known or proposed to be used for fabricating organic electronic devices. For example, the polymer solution can be deposited using a printing process, such as inkjet printing, nozzle printing, offset printing, transfer printing, or screen printing; or for example, using a coating process, such as spray coating, spin coating, or dip coating. After deposition of the solution, the solvent is removed, which may be performed by using conventional method such as vacuum drying and/or heating. The film is preferably formed on a substrate by a solution process, preferably by spin coating or by an ink jet process.

When the film has been produced by spin coating, the spin-coated film thickness is determined mainly by the solid contents in solution and the spin rate. For example, at a 2000 rpm spin rate, 2, 5, 8, and 10 wt % polymer, formulated solutions result in film thicknesses of 30, 90, 160 and 220 nm, respectively.

The polymer layer formed by coating the polymer composition on a surface may be baked at a temperature from 50 to 150° C. (preferably 80 to 120° C.), preferably for less than five minutes, followed by thermal cross-linking at a temperature from 120 to 280° C.; preferably at least 140° C., preferably at least 160° C., preferably at least 170° C.; preferably no greater than 230° C., preferably no greater than 215° C. Preferably the wet film shrinks by 5% or less after baking and annealing. Preferably, the duration of the exposure to hot atmosphere is 2 minutes or more; more preferably 5 minutes or more. Preferably the atmosphere is inert; more preferably the atmosphere contains 1% or less by weight oxygen gas; more preferably the atmosphere contains 99% or more nitrogen by weight.

The polymer thin layer may further be cross-linked. Cross-linking may be performed by exposing the layer solution to heat and/or actinic radiation, including UV light, gamma rays, or x-rays. Cross-linking may be carried out in the presence of an initiator that decomposed under heat or irradiation to produce free radicals or ions that initiate the cross-linking reaction. The cross-linking may be performed in-situ during the fabrication of a device. After cross-linking, the polymeric layer made thereof is preferably free of residual moieties which are reactive or decomposable with exposure to light, positive charges, negative charges or excitons.

Preferably, the polymer layer is resistant to dissolution by solvent (solvent resistance is sometimes referred to as "solvent orthogonality"). Solvent resistance is useful because, after making the layer of the QLED that contains the polymer composition of the present invention, a subsequent layer may be applied to the layer that contains the composition of the present invention. In many cases, the subsequent layer will be applied by a solution process. It is desirable that the solvent in the subsequent solution process does not dissolve or significantly degrade the layer that contains the composition of the present invention. The process of solution deposition and cross-linking can be repeated to create multiple layers.

When the polymer composition of the present invention is present in an HTL, preferably the HTL will be formed by a solution process. A subsequent layer may be applied to the HTL; the subsequent layer is typically an emitting layer. If the subsequent layer is applied by a solution process, preferably the HTL is resistant to dissolution in the solvent used in the solution process for applying the subsequent layer.

An exemplary organic electronic device comprises semiconductor nanoparticles as the emissive layer in the device. The device comprises a substrate, a first electrode, a hole injection layer, the hole transport layer (as disclosed herein), a nanoparticle, an electron transport layer and a second electrode. The substrate generally comprises an optically transparent, electrically insulating glass or an optically transparent, electrically insulating polymer. The first electrode can comprise an optically transparent conductive polymer or metal oxide. Examples of the first electrode are indium tin oxide, tin oxide, thin films of polypyrrole, polyaniline, polythiophene, or the like. A suitable hole injection material for use in the hole injection layer is PEDOT:PSS (poly(3,4-ethylenedioxythiophene)/poly(styrenesulfonate), which is a polymer mixture of two ionomers. The electron transport layer comprises zinc oxide or titanium oxide nanoparticles. The second electrode (which serves as the cathode) comprises a metal film, an example of which is an aluminum film. Other materials may be used in the first electrode, the hole injection layer, the electron transport layer and the second electrode.

In an embodiment, the display devices may be a pixelated light emitting diode that can emit light of single color (a single wavelength) or of a plurality of colors (light having different wavelengths). For example, it can emit white light or can emit red, green and blue light that can be combined to produce white light. The article may be used to produce light in the entire visible light spectrum.

In an embodiment, the display device may have a color conversion layer. The color conversion layer may comprise periodical nanospheres that help extract the confined light in the device and also increase the effective light path to achieve more efficient color conversion.

The materials disclosed herein may be used in flat displays, curved displays, and transparent displays and in multilayer displays.

The materials disclosed herein may be used as lighting such as, for example, white lighting, red lighting, conformal light coatings, color adjusting lighting, lighting for sign boards, or the like.

EXAMPLES

The following examples illustrate embodiments of the present disclosure. All parts and percentages are by weight unless otherwise indicated.

All solvents and reagents are available from commercial vendors, for example, Sigma-Aldrich, TCI, and Alfa Aesar, and are used in the highest available purities, and/or when necessary, recrystallized before use. Dry solvents were obtained from in-house purification/dispensing system (hexane, toluene, and tetrahydrofuran), or purchased from Sigma-Aldrich. All experiments involving "water sensitive compounds" are conducted in "oven dried" glassware, under nitrogen atmosphere, or in a glovebox.

The following standard analytical equipment and methods are used in the Examples.

Gel Permeation Chromatography (GPC)

Gel permeation chromatography (GPC) is used to analysis the molecular weights of the polymers. 2 mg of HTL polymer was dissolved in 1 mL THF. The solution was filtrated through a 0.20 µm polytetrafluoroethylene (PTFE) syringe filter and 50 µl of the filtrate was injected onto the GPC system. The following analysis conditions were used: Pump: Waters™ e2695 Separations Modules at a nominal flow rate of 1.0 mL/min; Eluent: Fisher Scientific HPLC grade THF (stabilized); Injector: Waters e2695 Separations Modules; Columns: two 5 µm mixed-C columns from Polymer Laboratories Inc., held at 40° C.; Detector: Shodex RI-201 Differential Refractive Index (DRI) Detector; Calibration: 17 polystyrene standard materials from Polymer Laboratories Inc., fit to a 3rd order polynomial curve over the range of 3742 kg/mol to 0.58 kg/mol.

Nuclear Magnetic Resonance (NMR)

$^1$H-NMR spectra (500 MHZ or 400 MHZ) were obtained on a Varian VNMRS-500 or VNMRS-400 spectrometer at 30° C. The chemical shifts are referenced to tetramethyl silane (TMS) (δ:000) in CDCl$_3$.

Liquid Chromatography-Mass Spectrometry (LC/MS)

Routine liquid chromatography/mass spectrometry (LC/MS) studies were carried out as follows. One microliter aliquots of the sample, as "1 mg/ml solution in tetrahydrofuran (THF)," are injected on an Agilent 1200SL binary liquid chromatography (LC), coupled to an Agilent 6520 quadruple time-of-flight (Q-TOF) MS system, via a dual electrospray interface (ESI), operating in the PI mode. The following analysis conditions are used: Column: Agilent Eclipse XDB-C18, 4.6*50 mm, 1.7 um; Column oven temperature: 30° C.; Solvent A: THF; Solvent B: 0.1% formic acid in water/Acetonitrile (v/v, 95/5); Gradient: 40-80% Solvent A in 0-6 min, and held for 9 min; Flow: 0.3 mL/min; UV detector: diode array, 254 nm; MS condition: Capillary Voltage: 3900 kV (Neg), 3500 kV (Pos); Mode: Neg and Pos; Scan: 100-2000 amu; Rate: is/scan; Desolvation temperature: 300° C.

Synthesis of HTL1 Monomer

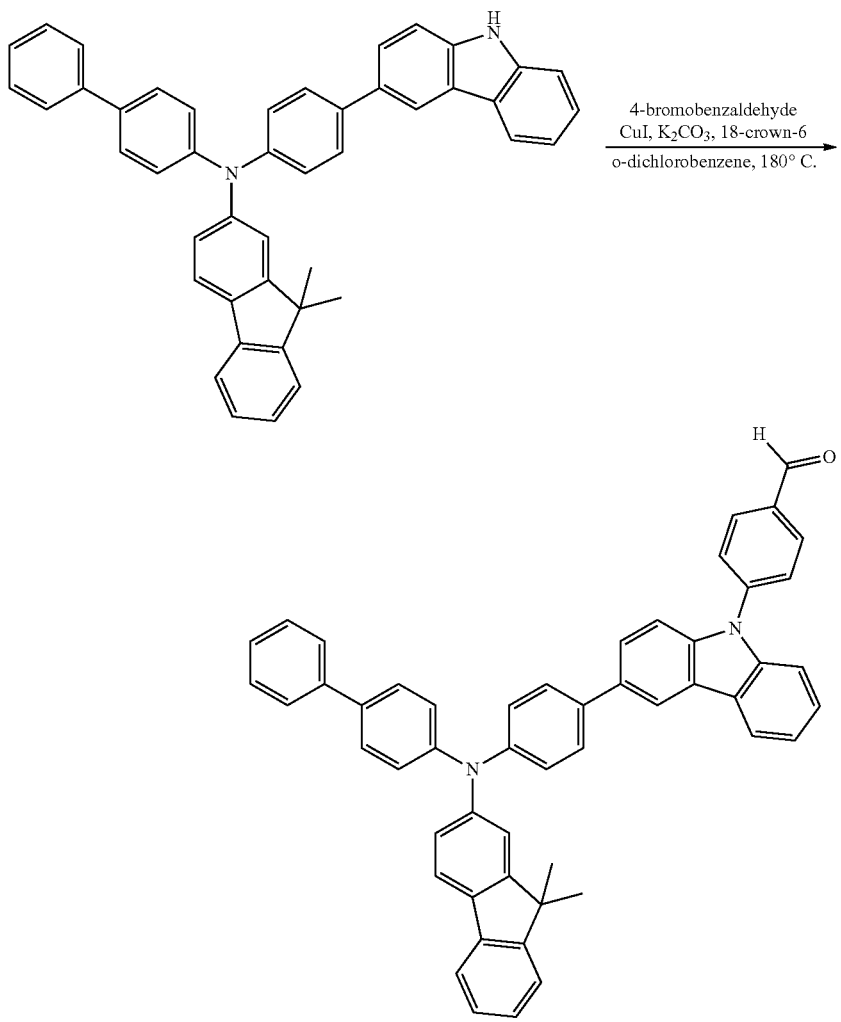

Synthesis of 4-(3-(4-([1,1'-biphenyl]-4-yl(9,9-dimethyl-9H-fluoren-2-yl)amino)phenyl)-9H-carbazol-9-yl)benzaldehyde A round-bottom flask was charged with N-(4-(9H-carbazol-3-yl)phenyl)-N-([1,1'-biphenyl]-4-yl)-9,9-dimethyl-9H-fluoren-2-amine (2.00 g, 3.318 mmol, 1.0 equiv), 4-bromobenzaldehyde (0.737 g, 3.982 mmol, 1.2 equiv), CuI (0.126 g, 0.664 mmol, 0.2 equiv), potassium carbonate (1.376 g, 9.954 mmol, 3.0 equiv), and 18-crown-6 (86 mg, 10 mol %). The flask was flushed with nitrogen and connected to a reflux condenser. 10.0 mL dry, degassed 1,2-dichlorobenzene was added, and the mixture was refluxed for 48 hours. The cooled solution was quenched with sat. aq. NH$_4$Cl, and extracted with dichloromethane. Combined organic fractions were dried, and solvent was removed by distillation. The crude residue was purified by chromatography on silica gel (hexane/chloroform gradient), and gave a bright yellow solid product (2.04 g). The product had the following characteristics: $^1$H-NMR (500 MHz, CDCl$_3$): δ 10.13 (s, 1H), 8.37 (d, J=2.0 Hz, 1H), 8.20 (dd, J=7.7, 1.0 Hz, 1H), 8.16 (d, J=8.2 Hz, 2H), 7.83 (d, J=8.1 Hz, 2H), 7.73-7.59 (m, 7H), 7.59-7.50 (m, 4H), 7.50-7.39 (m, 4H), 7.39-7.24 (m, 10H), 7.19-7.12 (m, 1H), 1.47 (s, 6H). $^{13}$C-NMR (126 MHz, CDCl$_3$): δ 190.95, 155.17, 153.57, 147.21, 146.98, 146.69, 143.38, 140.60, 140.48, 139.28, 138.93, 135.90, 135.18, 134.64, 134.46, 133.88, 131.43, 128.76, 127.97, 127.81, 126.99, 126.84, 126.73, 126.65, 126.54, 126.47, 125.44, 124.56, 124.44, 124.12, 123.98, 123.63, 122.49, 120.96, 120.70, 120.57, 119.47, 118.92, 118.48, 110.05, 109.92, 46.90, 27.13.

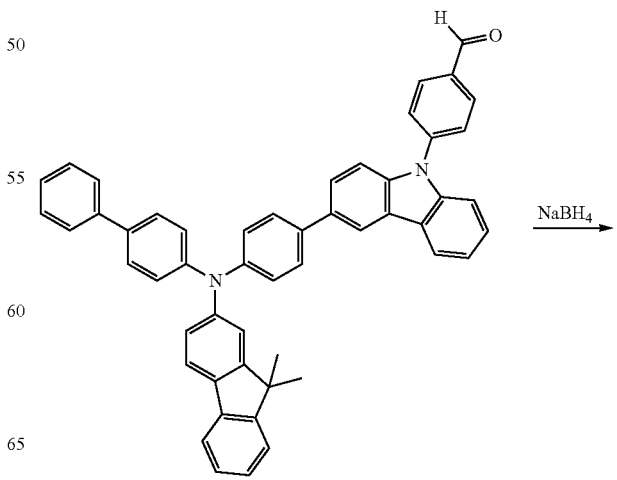

Synthesis of (4-(3-(4-([1,1'-biphenyl]-4-yl(9,9-dimethyl-9H-fluoren-2-yl)amino)phenyl)-9H-carbazol-9-yl)phenyl)methanol

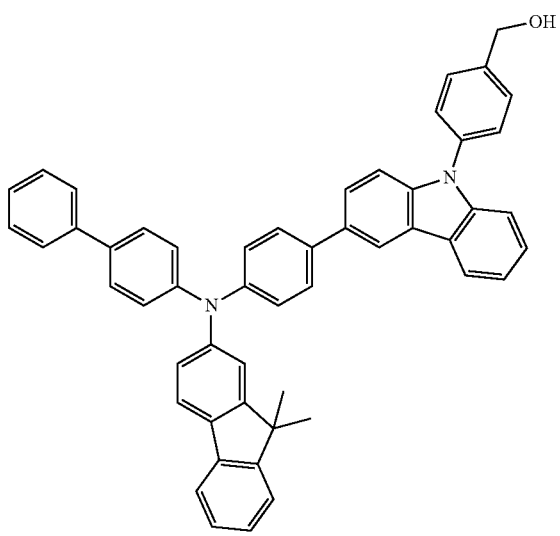

A round-bottom flask was charged with Formula 1 (4.36 g, 6.17 mmol, 1.00 equiv) under a blanket of nitrogen. The material was dissolved in 40 mL 1:1 THF:EtOH. borohydride (0.280 g, 7.41 mmol, 1.20 equiv) was added in portions and the material was stirred for 3 hours. The reaction mixture was cautiously quenched with 1M HCl, and the product was extracted with portions of dichloromethane. Combined organic fractions were washed with sat. aq. sodium bicarbonate, dried with $MgSO_4$ and concentrated to a crude residue. The material was purified by chromatography (hexane/dichloromethane gradient), and gave a white solid product (3.79 g). The product had the following characteristics: $^1$H-NMR (500 MHz, $CDCl_3$): δ 8.35 (s, 1H), 8.19 (dt, J=7.8, 1.1 Hz, 1H), 7.73-7.56 (m, 11H), 7.57-7.48 (m, 2H), 7.48-7.37 (m, 6H), 7.36-7.23 (m, 9H), 7.14 (s, 1H), 4.84 (s, 2H), 1.45 (s, 6H). $^{13}$C-NMR (126 MHz, $CDCl_3$): δ 155.13, 153.56, 147.24, 147.02, 146.44, 141.27, 140.60, 140.11, 140.07, 138.94, 136.99, 136.33, 135.06, 134.35, 132.96, 128.73, 128.44, 127.96, 127.76, 127.09, 126.96, 126.79, 126.62, 126.48, 126.10, 125.15, 124.52, 123.90, 123.54, 123.49, 122.46, 120.66, 120.36, 120.06, 119.43, 118.82, 118.33, 109.95, 109.85, 64.86, 46.87, 27.11.

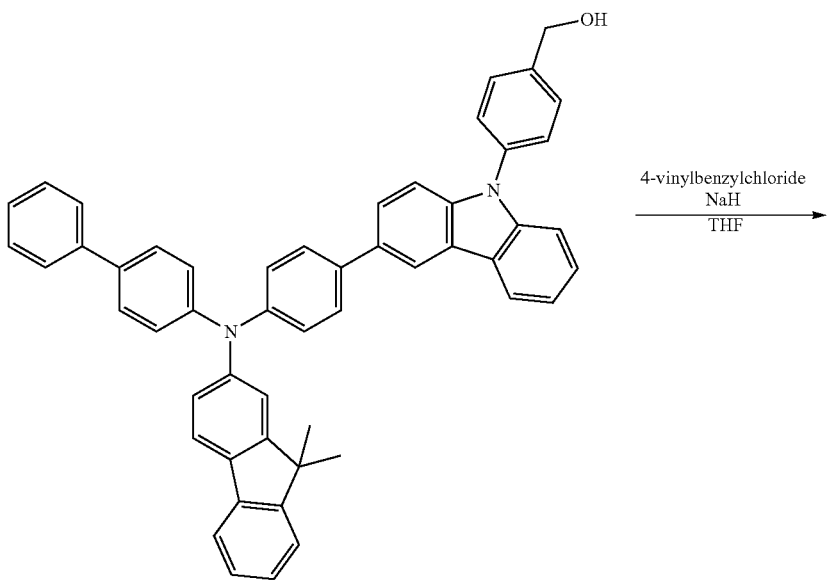

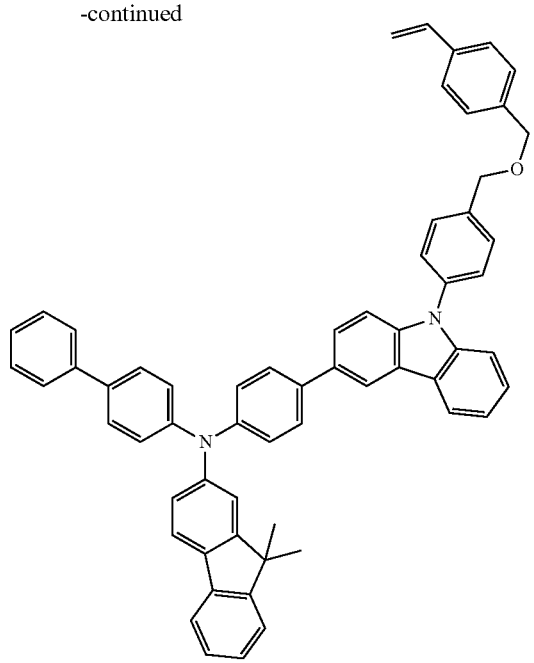

Synthesis of N-([1,1'-biphenyl]-4-yl)-9,9-dimethyl-N-(4-(9-(4-(((4-vinylbenzyl)oxy)methyl)phenyl)-9H-carbazol-3-yl)phenyl)-9H-fluoren-2-amine In a nitrogen-filled glovebox, a 100 mL round-bottom flask was charged with (4-(3-(4-([1,1'-biphenyl]-4-yl(9,9-dimethyl-9H-fluoren-2-yl)amino)phenyl)-9H-carbazol-9-yl)phenyl)methanol (4.40 g, 6.21 mmol, 1.00 equiv) and 35 mL THF. Sodium hydride (0.224 g, 9.32 mmol, 1.50 equiv) was added in portions, and the mixture was stirred for 30 minutes. A reflux condenser was attached, the unit was sealed and removed from the glovebox. 4-vinylbenzyl chloride (1.05 mL, 7.45 mmol, 1.20 equiv) was injected, and the mixture was refluxed until consumption of starting material. The reaction mixture was cooled (iced bath) and cautiously quenched with isopropanol. Sat. aq. NH$_4$Cl was added, and the product was extracted with ethyl acetate. Combined organic fractions were washed with brine, dried with MgSO$_4$, filtered, concentrated, and purified by chromatography on silica. The product had the following characteristics: $^1$H-NMR (400 MHz, CDCl$_3$): δ 8.35 (s, 1H), 8.18 (dt, J=7.8, 1.0 Hz, 1H), 7.74-7.47 (m, 14H), 7.47-7.35 (m, 11H), 7.35-7.23 (m, 9H), 7.14 (s, 1H), 6.73 (dd, J=17.6, 10.9 Hz, 1H), 5.76 (dd, J=17.6, 0.9 Hz, 1H), 5.25 (dd, J=10.9, 0.9 Hz, 1H), 4.65 (s, 4H), 1.45 (s, 6H). $^{13}$C-NMR (101 MHz, CDCl$_3$): δ 155.13, 153.56, 147.25, 147.03, 146.43, 141.28, 140.61, 140.13, 138.94, 137.64, 137.63, 137.16, 137.00, 136.48, 136.37, 135.06, 134.35, 132.94, 129.21, 128.73, 128.05, 127.96, 127.76, 126.96, 126.94, 126.79, 126.62, 126.48, 126.33, 126.09, 125.14, 124.54, 123.89, 123.54, 123.48, 122.46, 120.66, 120.34, 120.04, 119.44, 118.82, 118.31, 113.92, 110.01, 109.90, 72.33, 71.61, 46.87, 27.11.

Synthesis of HTL2 Monomer

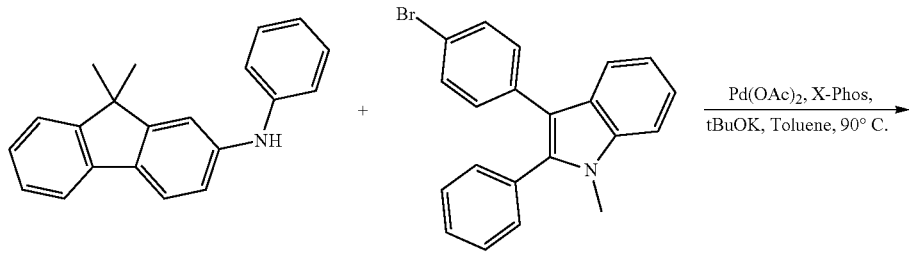

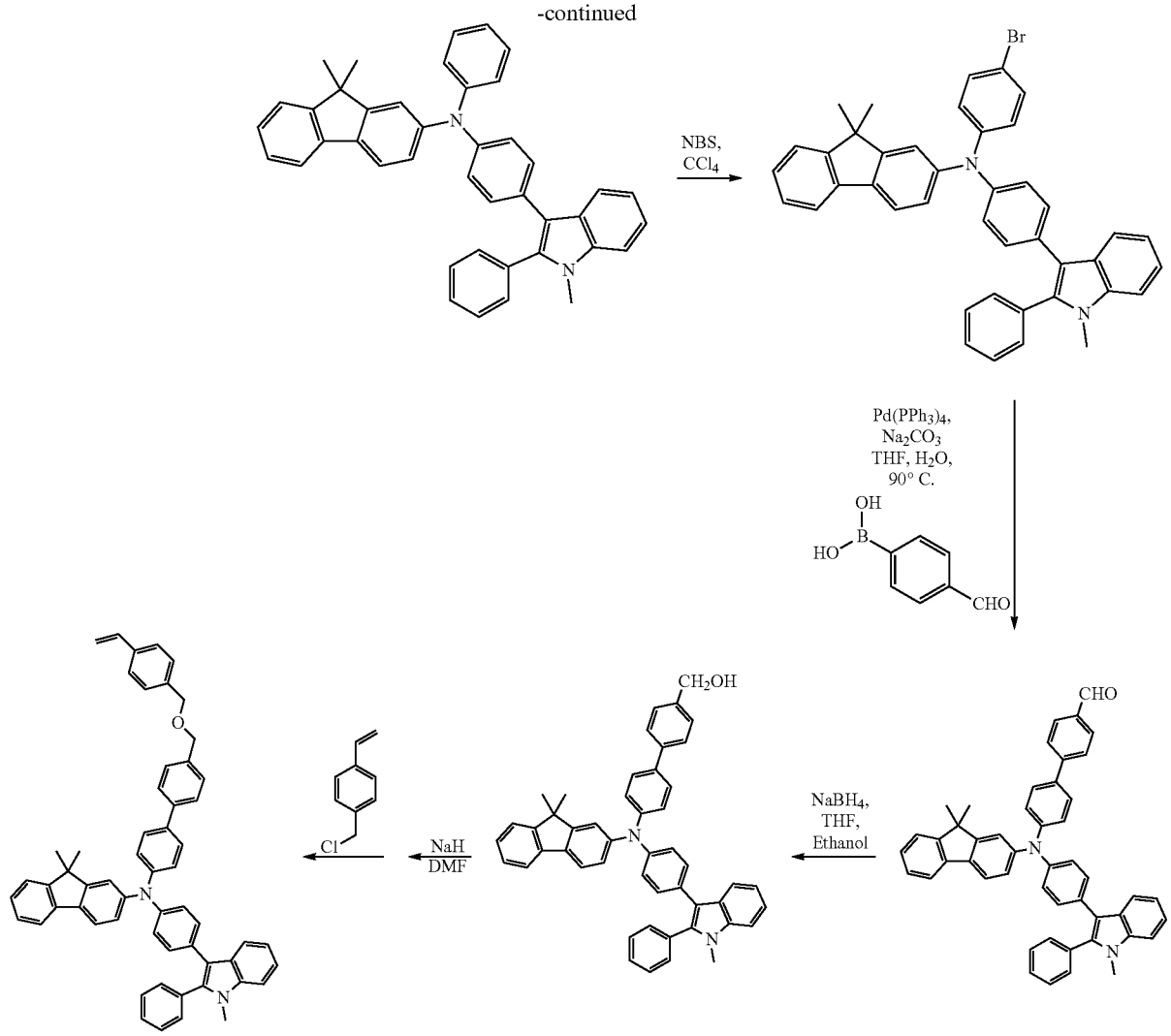

Synthesis of 4'-((9,9-dimethyl-9H-fluoren-2-yl)(4-(1-methyl-2-phenyl-1H-indol-3-yl)phenyl) amino)-[1,1'-biphenyl]-4-carbaldehyde A mixture of N-(4-bromophenyl)-9,9-dimethyl-N-(4-(1-methyl-2-phenyl-1H-indol-3-yl)phenyl)-9H-fluoren-2-amine (1) (12.9 g, 20 mmol), (4-formylphenyl) boronic acid (1.07 g, 30 mmol), Pd(PPh$_3$)$_4$ (693 mg, 1155, 3%), 2M K$_2$CO$_3$ (4.14 g, 30 mmol, 15 mL H2O), and 45 mL of THF was heated at 80° C. under nitrogen atmosphere for 12 h. After cooling to room temperature, the solvent was removed under vacuum and the residue was extracted with dichloromethane. After cooling to room temperature, the solvent was removed under vacuum and then water was added. The mixture was extracted with CH$_2$Cl$_2$. The organic layer was collected and dried over anhydrous sodium sulphate. After filtration, the filtrate was evaporated to remove solvent and the residue was purified through column chromatography on silica gel to give light-yellow solid (yield: 75%). MS (ESI): 671.80 [M+H]$_+$. 1H-NMR (CDCl$_3$, 400 MHz, TMS, ppm): δ 10.03 (s, 1H), 7.94 (d, 2H), 7.75 (d, 2H), 7.64 (m, 2H), 7.55 (d, 2H), 7.41 (m, 9H), 7.23 (m, 8H), 7.09 (m, 3H), 3.69 (s, 3H), 1.43 (s, 6H).

Synthesis of (4'-((9,9-dimethyl-9H-fluoren-2-yl)(4-(1-methyl-2-phenyl-1H-indol-3-yl) phenyl)amino)-[1,1'-biphenyl]-4-yl)methanol To a solution of 4'-((9,9-dimethyl-9H-fluoren-2-yl)(4-(1-methyl-2-phenyl-1H-indol-3-yl)phenyl)amino)-[1,1'-biphenyl]-4-carbaldehyde (10 g, 15 mmol) in 50 mL THF and 50 mL ethanol at 40° C., NaBH$_4$ (2.26 g, 60 mmol) was added under nitrogen atmosphere. The solution was allowed to stir at room temperature for 2 h. Then, aqueous hydrochloric acid solution was added until pH 5 and the addition was maintained for a further 30 min. The solvent was removed under vacuum and the residue was extracted with dichloromethane. The product was then obtained by remove of solvent and used for next step without further purification (yield: 95%). MS (ESI): 673.31 [M+H]$^+$.

Synthesis of 9,9-dimethyl-N-(4-(1-methyl-2-phenyl-1H-indol-3-yl)phenyl)-N-(4'-(((4-vinylbenzyl)oxy)methyl)-[1,1'-biphenyl]-4-yl)-9H-fluoren-2-amine To a solution of (4'-((9,9-dimethyl-9H-fluoren-2-yl)(4-(1-methyl-2-phenyl-1H-indol-3-yl) phenyl)amino)[1,1'-biphenyl]-4-yl)methanol (9.0 g, 13.4 mmol) in 50 mL dry DMF was added NaH (482 mg, 20.1 mmol), the mixture was then stirred at room temperature for 1 h. And 4-vinylbenzyl chloride (3.05 g, 20.1 mmol) was added to above solution via syringe. The mixture was heated to 50° C. for 24 h. After quenched with water, the mixture was poured into water to remove DMF. The residue was filtrated and the resulting solid was dissolved with dichloromethane, which was then washed with water. The solvent was removed under vacuum and the residue was extracted with dichloromethane. The product was then obtained by column chromatography on silica gel (yield: 90%). MS (ESI): 789.38 [M+H]$^+$. 1H-NMR (CDCl$_3$, 400 MHz, TMS, ppm): δ 7.59 (d, 4H), 7.48 (m, 2H), 7.40 (m, 18H), 7.22 (m, 8H), 6.71 (dd, 1H), 5.77 (d, 1H), 5.25 (d, 1H), 4.58 (s, 4H), 3.67 (s, 3H), 1.42 (s, 6H).

Synthesis of HTL3 Monomer

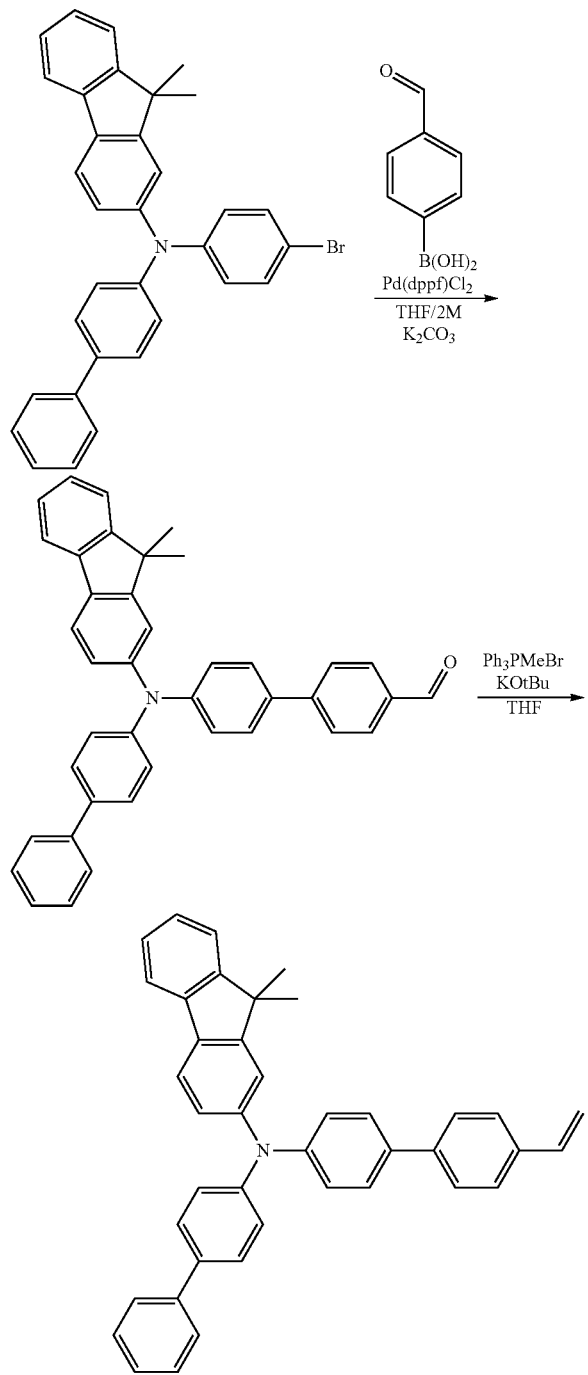

Synthesis of 4'-([1,1'-biphenyl]-4-yl(9,9-dimethyl-9H-fluoren-2-yl)amino)-[1,1'-biphenyl]-4-carbaldehyde A 1 L, 3-neck round bottom flask, fitted with a thermocouple, a condenser with an N$_2$ inlet, and a septum was charged with [1] (20 g, 38.7 mmol, 1 equiv.), 4-formylphenylboronic acid (6.42 g, 42.6 mmol, 1.1 equiv.), tetrahydrofuran (315 mL), and 2 M aqueous K$_2$CO$_3$ (58 mL). The mixture was stirred and sparged with N$_2$ for 30 minutes. Pd(dppf)Cl$_2$ (0.55 g, 0.75 mmol, 0.02 equiv.) was added, and the reaction was heated to reflux for 21 h. Tetrahydrofuran was distilled away, and the reaction was diluted with water (300 mL) and extracted with dichloromethane (2×300 mL). The combined organic phases were dried of MgSO$_4$, filtered and condensed on to silica. The material was chromatographed using a gradient eluent (1 column volume hexanes increasing to 1:1 hexanes:dichloromethane over 8 column volumes, then maintaining the 1:1 ratio for 10 column volumes). Combined fractions were condensed to yield a bright yellow solid (15.2 g, 72%, purity 99.5%).

$^1$H NMR (400 MHz, C$_6$D6) δ 9.74 (s, 1H), 7.61 (2H, dd, J=8 Hz, 2 Hz), 7.55 (2H, dd, J=20 Hz, 2.4 Hz), 7.50-7.46 (5H, multiple peaks), 7.37-7.11 (15H, multiple peaks), 1.28 (s, 6H).

$^{13}$C NMR (101 MHz, C$_6$D6) δ 190.64, 155.70, 153.83, 148.64, 147.24, 147.05, 146.04, 140.76, 139.10, 136.52, 135.61, 135.38, 133.68, 130.22, 129.01, 128.43, 128.36, 127.39, 127.18, 127.12, 126.95, 126.94, 124.93, 124.44, 123.82, 122.74, 121.29, 119.88, 119.61, 46.95 z, 26.93.

Synthesis of N-([1,1'-biphenyl]-4-yl)-9,9-dimethyl-N-(4'-vinyl-[1,1'-biphenyl]-4-yl)-9H-fluoren-2-amine A 500 mL round bottom flask 3-neck round bottom flask, fitted with a thermocouple, a condenser with an N$_2$ inlet, and a septum was charged with methyltriphenylphosphonium bromide (18.44 g, 51.6 mmol, 2 equiv.) and dry tetrahydrofuran (148 mL). Potassium tert-butoxide (6.8 g, 60.6 mmol, 2.3 equiv.) was added, and the mixture stirred for 15 minutes. 4'-([1,1'-biphenyl]-4-yl(9,9-dimethyl-9H-fluoren-2-yl)amino)-[1,1'-biphenyl]-4-carbaldehyde [9] (14.03 g, 25.9 mmol, 1 equiv.) was dissolved in dry tetrahydrofuran (74 mL) and added to the methyltriphenylphosphonium bromide solution. The reaction was stirred for 16 h at room temperature. Water (4 mL) was added, and the mixture was filtered through a plug of silica. The pad was rinsed with dichloromethane (423 g), and the filtrate was adsorbed to silica and purified by chromatography using a gradient eluent (1 column volume hexanes increasing to 80:20 hexanes: dichloromethane over 19 column volumes, then maintaining the 80:20 ratio for 10 column volumes). The combined fractions were condensed to yield a yellow oily solid that was triturated with methanol to yield a white solid (10.57 g, 76%, purity 99.8%).

$^1$H NMR (400 MHz, C$_6$D6) δ 7.55-7.43 (multiple peaks, 11H), 7.33-7.10 (multiple peaks 13H), 6.63 (1H, dd, J=20 Hz, 12 Hz) 5.66 (1H, dd, J=20 Hz, 1.2 Hz), 5.11 (1H, dd, J=12 Hz, 1.2 Hz), 1.27 (s, 6H).

$^{13}$C NMR (101 MHz, C$_6$D6) δ 155.61, 153.85, 147.66, 147.57, 147.39, 140.91, 140.28, 139.25, 136.82, 136.51, 136.04, 135.41, 135.19, 128.98, 128.28, 128.02, 127.78, 127.34, 127.04, 127.02, 126.98, 126.94, 124.60, 124.52, 124.15, 122.71, 121.23, 119.81, 119.30, 113.42, 46.93, 26.94.

Synthesis of HTL4 Monomer
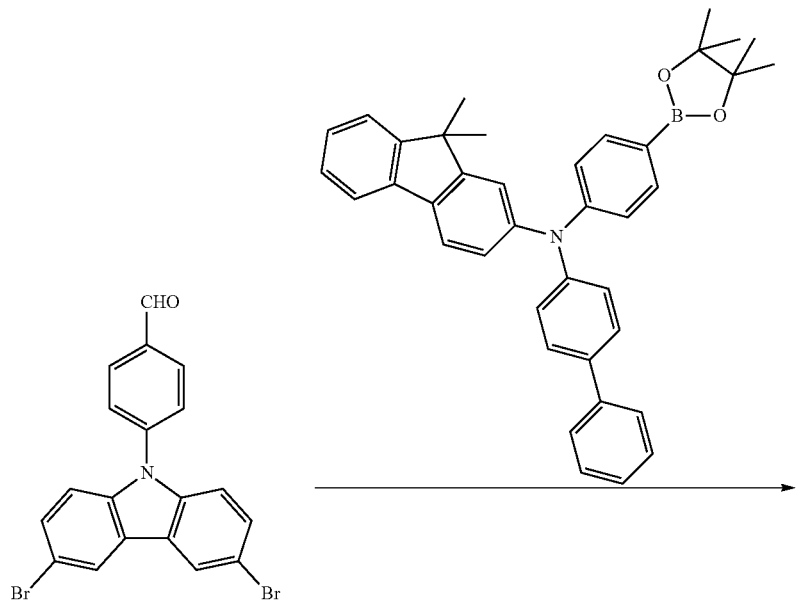
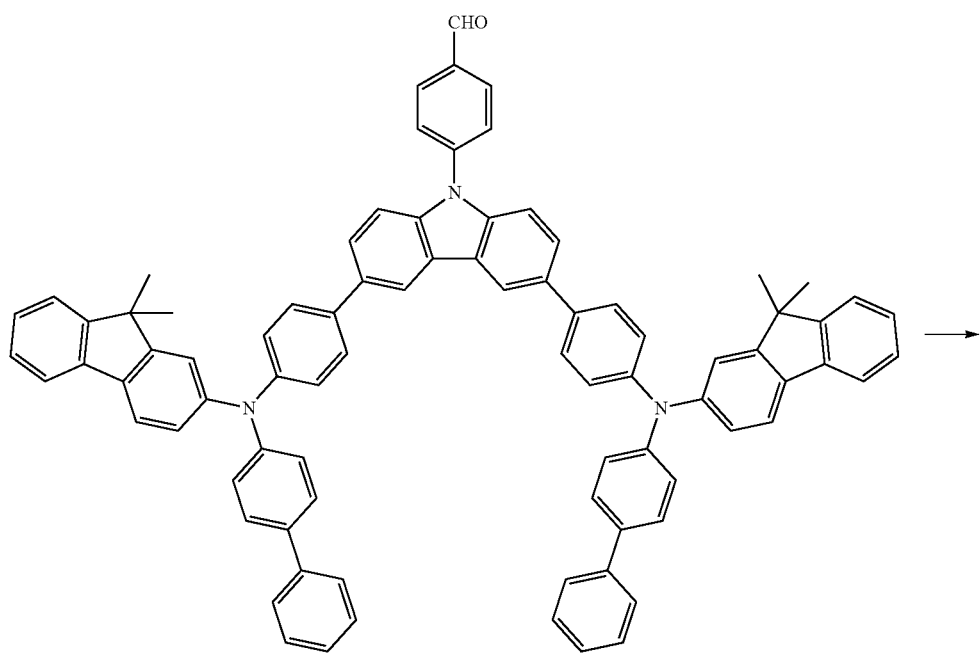

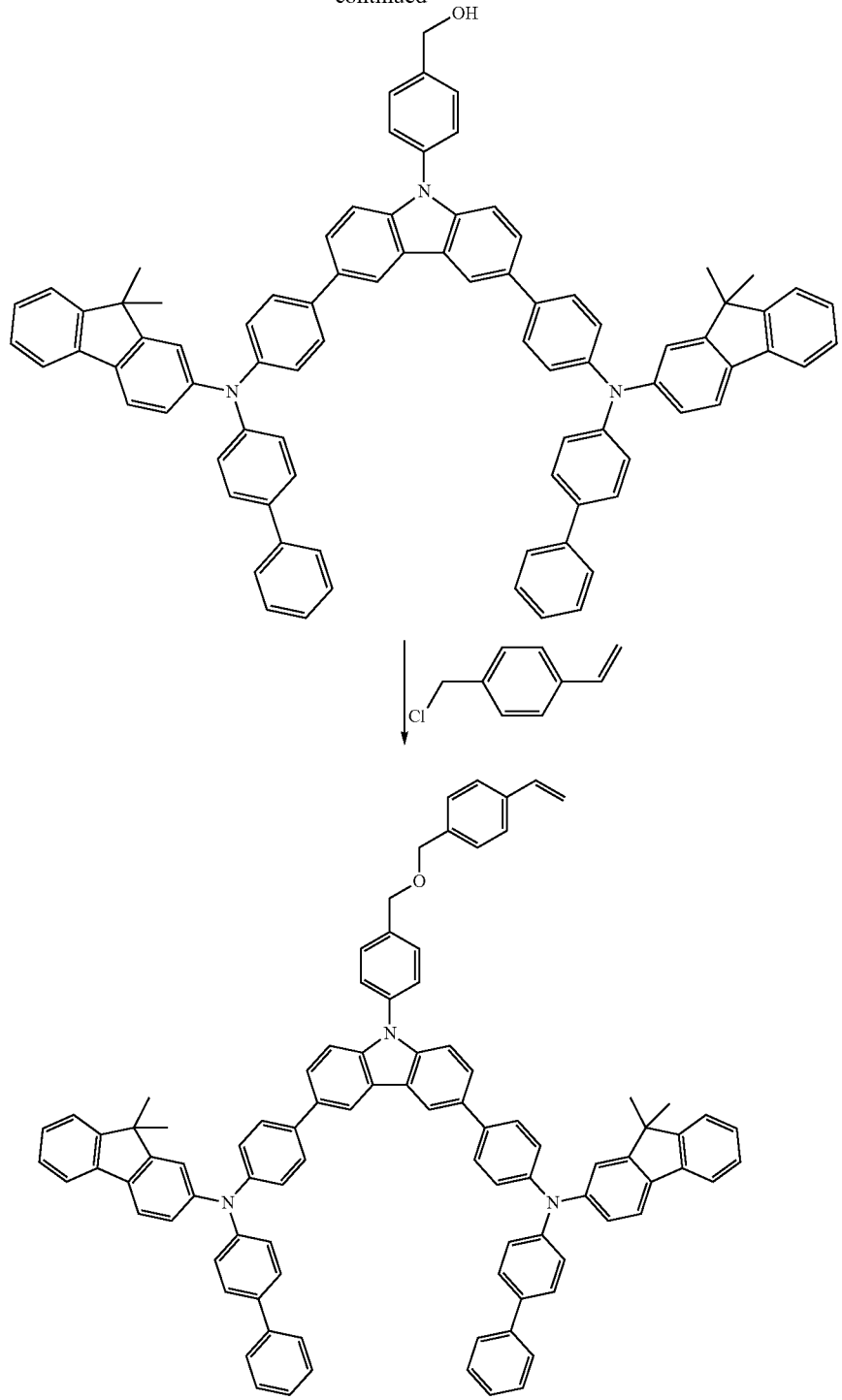

Synthesis of 4-(3,6-bis(4-([1,1'-biphenyl]-4-yl(9,9-dimethyl-9H-fluoren-2-yl)amino)phenyl)-9H-carbazol-9-yl)benzaldehyde A mixture of 4-(3,6-dibromo-9H-carbazol-9-yl)benzaldehyde (6.00 g, 17.74 mmol), N-([1,1'-biphenyl]-4-yl)-9,9-dimethyl-N-(4-(4,4,5,5-tetramethyl-1,3,2-dioxaborolan-2-yl)phenyl)-9H-fluoren-2-amine (15.70 g, 35.49 mmol), Pd(PPh$_3$)$_3$ (0.96 g), 7.72 g K$_2$CO$_3$, 100 mL THF and 30 mL H$_2$O was heated at 80° C. under nitrogen overnight. After cooled to room temperature, the solvent was removed under vacuum and the residue was extracted with dichloromethane. The product was then obtained by column chromatography on silica gel with petroleum ether and dichloromethane as eluent, to provide desired product (14.8 g, yield 92%).

$^1$H NMR (CDCl$_3$, ppm): 10.14 (s, 1H), 8.41 (d, 2H), 8.18 (d, 2H), 7.86 (d, 2H), 7.71 (dd, 2H), 7.56-7.68 (m, 14H), 7.53 (m, 4H), 7.42 (m, 4H), 7.26-735 (m, 18H), 7.13-7.17 (d, 2H), 1.46 (s, 12H).

Synthesis of (4-(3,6-bis(4-([1,1'-biphenyl]-4-yl(9,9-dimethyl-9H-fluoren-2-yl)amino)phenyl)-9H-carbazol-9-yl)phenyl)methanol 4-(3,6-bis(4-([1,1'-biphenyl]-4-yl(9,9-dimethyl-9H-fluoren-2-yl)amino)phenyl)-9H-carbazol-9-yl)benzaldehyde (10.0 g, 8.75 mmol) was dissolved into 80 mL THF and 30 mL ethanol. NaBH$_4$ (1.32 g, 35.01 mmol) was added under nitrogen atmosphere over 2 hours. Then, aqueous hydrochloric acid solution was added until pH 5 and the mixture was kept stirring for 30 min. The solvent was removed under vacuum and the residue was extracted with dichloromethane. The product was then dried under vacuum and used for the next step without further purification.

Synthesis of N,N'-((9-(4-(((4-vinylbenzyl)oxy)methyl)phenyl)-9H-carbazole-3,6-diyl)bis(4,1-phenylene))bis(N-([1,1'-biphenyl]-4-yl)-9,9-dimethyl-9H-fluoren-2-amine)

0.45 g 60% NaH was added to 100 mL dried DMF solution of 10.00 g of (4-(3,6-bis(4-([1,1'-biphenyl]-4-yl(9,9-dimethyl-9H-fluoren-2-yl)amino)phenyl)-9H-carbazol-9-yl)phenyl)methanol. After stirred at room temperature for 1 h, 2.00 g of 1-(chloromethyl)-4-vinylbenzene was added by syringe. The solution was stirred at 60° C. under N$_2$ and tracked by TLC. After the consumption of the starting material, the solution was cooled and poured into ice water. After filtration and washed with water, ethanol and petroleum ether respectively, the crude product was obtained and dried in vacuum oven at 50° C. overnight and then purified by flash silica column chromatography with grads evolution of the eluent of dichloromethane and petroleum ether (1:3 to 1:1). The crude product was further purified by recrystallization from ethyl acetate and column chromatography which enabled the purity of 99.8%. ESI-MS (m/z, Ion): 1260.5811, (M+H)$^+$. $^1$H NMR (CDCl$_3$, ppm): 8.41 (s, 2H), 7.58-7.72 (m, 18H), 7.53 (d, 4H), 7.38-7.50 (m, 12H), 7.25-7.35 (m, 16H), 7.14 (d, 2H), 6.75 (q, 1H), 5.78 (d, 1H), 5.26 (d, 1H), 4.68 (s, 4H), 1.45 (s, 12H).

Preparation for HTL Polymers:

In a glovebox, the monomer (1.00 equiv) was dissolved in anisole (electronic grade, 0.25 M). The mixture was heated to 70° C., and AIBN solution (0.20 M in toluene, 5 mol %) was injected. The mixture was stirred until complete consumption of monomer, at least 24 hours (2.5 mol % portions of AIBN solution can be added to complete conversion). The polymer was precipitated with methanol (10× volume of anisole) and isolated by filtration. The filtered solid was rinsed with additional portions of methanol. The filtered solid was re-dissolved in anisole and the precipitation/filtration sequence repeated twice more. The isolated solid was placed in a vacuum oven overnight at 50° C. to remove residual solvent.

HTL Polymer Structures and Molecular Weights (MW)

$M_n$: Number-averaged MW; $M_w$: Weight-averaged MW; $M_z$: Z-averaged MW; $M_{z+1}$: Z+1-averaged MW. PDI=$M_w$/$M_n$: Polydispersity

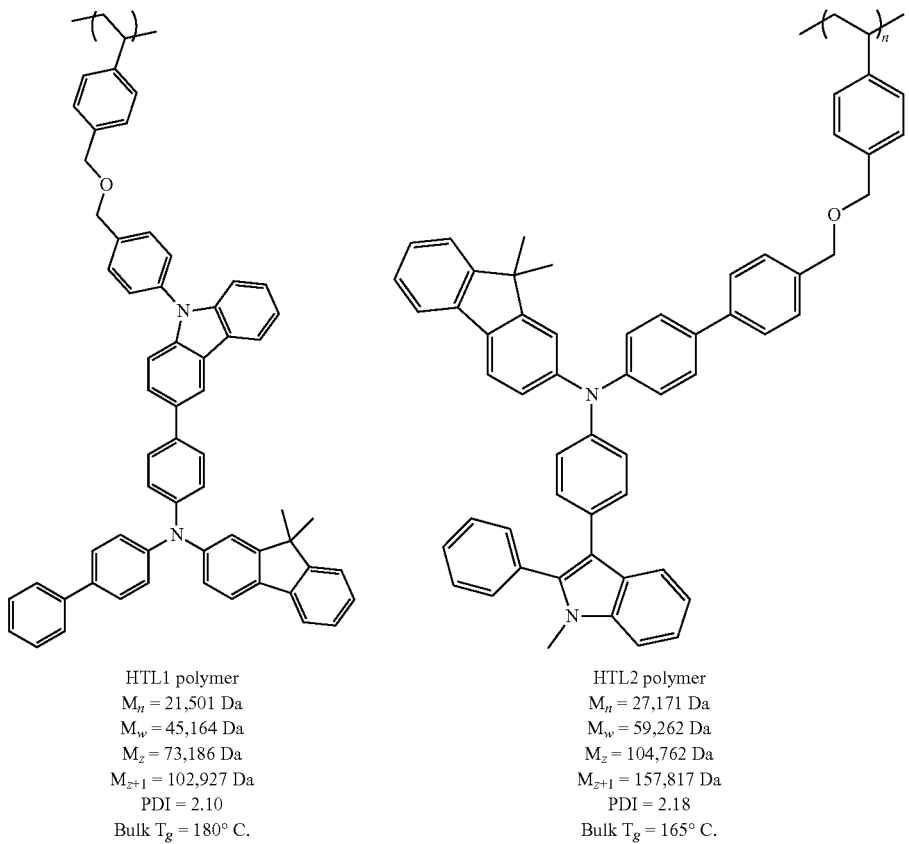

HTL1 polymer
$M_n$ = 21,501 Da
$M_w$ = 45,164 Da
$M_z$ = 73,186 Da
$M_{z+1}$ = 102,927 Da
PDI = 2.10
Bulk T$_g$ = 180° C.

HTL2 polymer
$M_n$ = 27,171 Da
$M_w$ = 59,262 Da
$M_z$ = 104,762 Da
$M_{z+1}$ = 157,817 Da
PDI = 2.18
Bulk T$_g$ = 165° C.

-continued
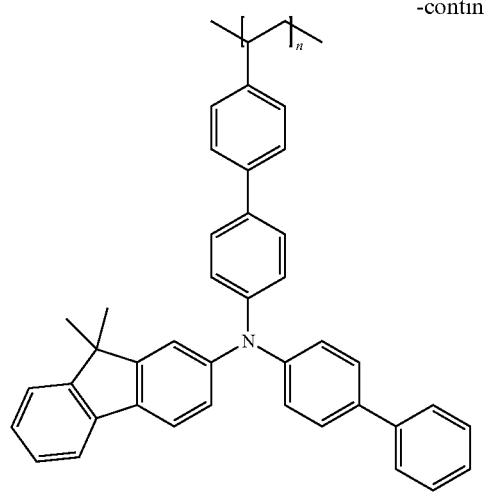
HTL3 polymer
$M_n$ = 22,175 Da
$M_w$ = 58,355 Da
$M_z$ = 101,033 Da
$M_{z+1}$ = 148, Da
PDI = 2.63
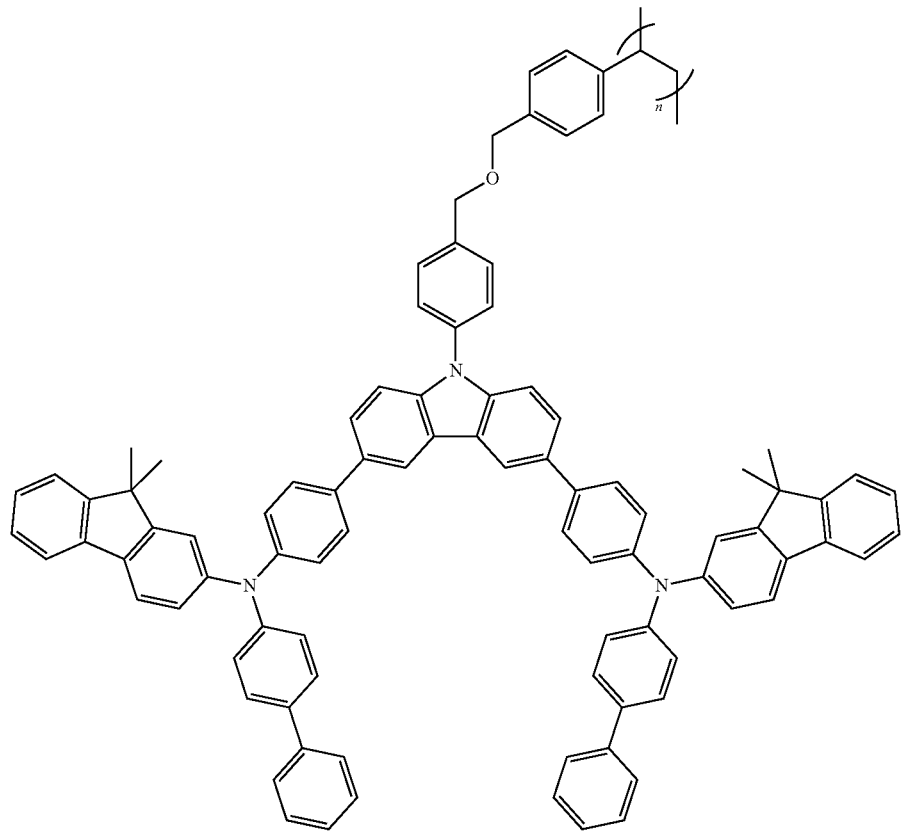
HTL4 polymer
$M_n$ = 21,482 Da
$M_w$ = 67,058 Da
$M_z$ = 132,385 Da
$M_{z+1}$ = 226,405 Da
PDI = 3.12
Bulk $T_g$ = 210° C.

QLED Device Fabrication

QLED devices were constructed as follows. Glass substrates (20 mm×15 mm) with pixelated tin-doped indium oxide (ITO) electrodes (Ossila Inc.) were used. The ITO was treated using oxygen plasma. The hole-injection layer (HIL) was Plexcore™ OC RG-1200 (Poly(thiophene-3-[2-(2-methoxyethoxy)ethoxy]-2,5-diyl) available from Sigma-Aldrich. The HIL solution was filtered with 0.45 micron polyvinylidene fluoride (PVDF) syringe filter and deposited into a layer by dynamic spin coating whereby 20 μL of the solution was dispensed onto a spinning substrate. The spin speed was approximately 2000 RPM to achieve a film thickness of approximately 40 nm. Some portions of the deposited film, which covered sections of the electrodes, were removed with toluene using a foam swab. The devices were then annealed at 150° C. for 30 minutes on a hot plate in an inert atmosphere.

To form the hole transport layer (HTL), each HTL polymer was individually dissolved in electronic grade anisole (2% w/w) at elevated temperature (<100° C.) to ensure complete dissolution and passed through a 0.2 μm polytetrafluoroethylene (PTFE) filter. The materials were deposited into a layer by dynamic spin coating whereby 20 μL of the solution was dispensed onto a spinning substrate. The spin speed (approximately 2000 RPM) was adjusted for each material to achieve a film thickness of approximately 40 nm. Some portions of the deposited film, which covered sections of the electrodes, were removed with toluene using a foam swab. The devices were then annealed at 205° C. for 10 minutes on a hot plate in an inert atmosphere. A well-studied literature HTL consisting of a 50:50 mixture of poly[(9,9-dioctylfluorenyl-2,7-diyl)-co-(4,40-(N-(4-sec-butylphenyl))diphenylamine)] (TFB) and 2,3,5,6-tetrafluoro-7,7,8,8-tetracyanoquinodimethane (F4TCNQ) was used as a reference.

The light emitting layer was selected from the list below. Each material was deposited into a layer by dynamic spin coating whereby 20 μL of the solution was dispensed onto a spinning substrate. The spin speed (approximately 2000 to 4000 RPM) was adjusted for each material to achieve a film thickness of approximately 5-15 nm. Some portions of the deposited film, which covered sections of the electrodes, were removed with toluene using a foam swab. The devices were then annealed at 180° C. for 10 minutes on a hot plate in an inert atmosphere.

Light emitting layer materials used were as follows:
1) CdSe/ZnS (520 nm emission);
2) InP/ZnS (620 nm emission); and
3) CdS/CdSe/ZnSe DHNR (600 nm emission).

The CdSe/ZnS and InP/ZnS were purchased from Aldrich as catalog numbers 748021 and 776777, respectively. The quantum dots were dispersed in toluene at a concentration of ~20 mg/ml, and used as is.

The DHNR was Synthesized According to the Following Procedure.

Technical grade trioctylphosphine oxide (90%), technical grade trioctylphosphine (TOP) (90%), technical grade oleic acid (90%), technical grade octadecene (90%), CdO (99.5%), Zn acetate (99.99%), S powder (99.998%) and Se powder (99.99%) were obtained from Sigma Aldrich. N-octadecyl phosphonic acid (ODPA) was obtained from PCI Synthesis. ACS grade chloroform and methanol were obtained from Fischer Scientific. All chemicals were used as received.

Synthesis of CdS Nanorods:

CdS nanorods were prepared in a manner similar to established methods 14. The reactions were carried out in a standard Schlenk line under N2 atmosphere. First, 2.0 g (5.2 mmol) of trioctylphosphine oxide, 0.67 g (2.0 mmol) of ODPA and 0.13 g (2.0 mmol) of CdO in a 50-ml three-neck round-bottom flask were degassed at 150° C. for 30 min under vacuum, and then heated to 350° C. with stirring. As the Cd-ODPA complex was formed at 350° C., the brown solution in the flask became optically transparent and colourless typically after 1 h. The solution was then cooled and degassed at 150° C. for 10 min to remove byproducts of complexation including $O_2$ and $H_2O$. After degassing, the solution was reheated to 350° C. under $N_2$ atmosphere. S precursor containing 16 mg (0.5 mmol) of S dissolved in 1.5 ml of TOP was swiftly injected into the flask with a syringe. Consequently, the reaction mixture was quenched to 330° C. where the CdS growth was carried out. After 15 min, the CdS nanorods growth was terminated by cooling to 250° C., where the CdSe growth on CdS nanorods was carried out. An aliquot of the CdS nanorods was taken and cleaned by precipitation with methanol and butanol for characterization. The CdS/CdSe heterostructures were formed by adding Se precursor slowly to the same reaction flask, maintained under $N_2$ atmosphere as described below.

Synthesis of CdS/CdSe Nanorod Heterostructures:

The one-pot synthesis of rod-rod-rod shaped nanorod heterostructures were carried out in a similar manner to the established method. Following the formation of CdS nanorods, Se precursors containing 20 mg (0.25 mmol) of Se dissolved in 1.0 ml of TOP was slowly injected at 250° C. at a rate of 4 ml h$^{-1}$ via syringe pump (total injection time ~15 min). The reaction mixture was then allowed to stir for an additional 5 min at 250° C. before being rapidly cooled by an air jet. An aliquot of CdS/CdSe nanorod heterostructures was taken and cleaned by precipitation with methanol and butanol for analysis. The final reaction mixture was dissolved in chloroform, and centrifuged at 2,000 RPM. The precipitate was re-dissolved in chloroform for the next step. This solution of CdS/CdSe nanorod heterostructures had an optical density of 0.75 (in a cuvette with 1 cm optical path length) at the CdS band-edge absorption peak when diluted by a factor of 10.

Synthesis of CdS/CdSe/ZnSe DHNRs:

CdS/CdSe/ZnSe DHNRs were synthesized by growing ZnSe onto CdS/CdSe nanorod heterostructures. For Zn precursor, 6 ml of octadecene, 2 ml of oleic acid and 0.18 g (1.0 mmol) of Zn acetate were degassed at 150° C. for 30 min. The mixture was heated to 250° C. under $N_2$ atmosphere, and consequently Zn oleate was formed after 1 h. 2 ml of previously prepared CdS/CdSe stock solution was injected into Zn oleate solution after cooling to 50° C. Chloroform was allowed to evaporate for 30 min under vacuum at 70° C. ZnSe growth was initiated by a slow injection of the Se precursor containing 39 mg (0.50 mmol) of Se dissolved in 2.0 ml of TOP to the reaction mixture at 250° C. Thickness of ZnSe on CdS/CdSe nanorod heterostructures was controlled by the amount of Se injected. The ZnSe growth was terminated by removing the heating mantle after injecting the desired amount of Se precursor. After washing twice with chloroform and methanol mixture (1:1 volume ratio), CdS/CdSe/ZnSe DHNRs were finally dispersed in toluene at (~30 mg ml$^{-1}$), ZnO Synthesis:

ZnO was used as the electron transport layer (ETL). The ZnO was synthesized according to a published literature procedure. Briefly, a solution of potassium hydroxide (1.48 g) in methanol (65 ml) was added to zinc acetate dihydrate (2.95 g) in methanol (125 ml) solution and the reaction mixture was stirred at 60° C. for 2 h. The mixture was then cooled to room temperature and the precipitate was washed twice with methanol. The precipitate was suspended in 1-butanol to form the final ZnO solution. The ZnO was deposited into a layer by dynamic spin coating whereby 20 µL of the solution was dispensed onto a spinning substrate. The spin speed, approximately 2000 RPM, was adjusted to achieve a film thickness of approximately 30 nm. Some portions of the deposited film, which covered sections of the electrodes, were removed with butanol using a foam swab. The devices were then annealed at 120° C. for 10 minutes on a hot plate in an inert atmosphere.

A 100 nm layer of aluminum was deposited by thermal evaporation under high vacuum from a graphite crucible through a cathode shadow mask.

The QLED devices were tested as follows. Current-Voltage-Light (JVL) data was collected on un-encapsulated devices inside a $N_2$ glovebox using a custom-made test board from Ossila Inc. The board contained two components: 1) X100 Xtralien™ precision testing source, and 2) Smart PV and OLED Board; in combination, these components were used to test QLED devices over a voltage range of −2 V to 7 V at increments of 0.1 V while measuring current and light output. The light output was measured using an eye response photodiode which includes an optical filter that mimics photopic eye sensitivity (Centronic E Series). The devices were placed inside of the testing chamber on the board and covered with the photodiode assembly. Electrical contact was made to the ITO electrodes by a series of spring-actuated gold probes inside of the Smart Board assembly. The photodiode was located at a distance of 3 mm above the ITO substrate. From the JVL data, critical device parameters were determined including the voltage required to reach 1000 cd/m² of brightness, the current efficiency (in cd/A) of the QLED at 1000 cd/m², and the driving voltage required to reach 10 mA/cm² of current in the QLED. A geometric factor was applied to the measured photodiode current to account for distance between the photodiode and the substrate (3 mm) and the relative positioning from each pixel on the substrate.

Results and Analysis

The HTL polymers listed below were fabricated into example quantum dot light emitting diodes. The example diodes performed acceptably in all tests including quantum dots composed of CdSe/ZnS, InP/ZnS and DHNRs. The example devices were shown to perform acceptably with quantum dot emission ranging from 520, to 600 and to 620 nm, as listed in the tables below. Example devices were shown to perform acceptably with spherical and rod-like quantum dots. The HTL compounds led to improved QLED device efficiency and driving voltages as compared to reference examples.

| HTL | MAXIMUM EFFICIENCY (CD/A) | EFFICIENCY @ 50 CD/M² | VOLTAGE @ 500 CD/M² (V) | VOLTAGE @ 10 MA (V) |
|---|---|---|---|---|
| QLED device performance with spherical CdSe/ZnS quantum dots emitting at 520 nm | | | | |
| HTL1 | 4.48 | 3.84 | 2.4 | 3.3 |
| HTL2 | 1.33 | 1.12 | 3.0 | 3.4 |
| HTL3 | 7.03 | 6.91 | 3.1 | 4.0 |
| HTL4 | 1.07 | 0.92 | 2.8 | 3.1 |
| REFERENCE | 1.21 | 0.89 | 3.8 | 4.1 |
| QLED device performance with spherical InP/ZnS quantum dots emitting at 620 nm | | | | |
| HTL1 | 1.26 | 1.16 | 3.1 | 3.6 |
| HTL2 | 0.43 | 0.35 | 4.3 | 3.9 |
| HTL3 | 2.13 | 0.75 | 4.6 | 4.7 |
| HTL4 | 1.20 | 0.82 | 3.6 | 3.9 |
| REFERENCE | 0.22 | 0.18 | 4.6 | 4.0 |
| QLED device performance with DHNRs emitting at 600 nm | | | | |
| HTL1 | 0.27 | 0.20 | 2.7 | 2.4 |
| HTL2 | 0.49 | 0.30 | 3.5 | 3.3 |
| HTL3 | 2.81 | 0.30 | 4.8 | 4.7 |
| HTL4 | 0.49 | 0.23 | 3.7 | 3.2 |
| REFERENCE | 0.15 | 0.15 | 4.8 | 4.3 |

What is claimed is:

1. A quantum dot light emitting diode comprising i) an emitting layer of at least one semiconductor nanoparticle made from semiconductor materials selected from the group consisting of Group II-VI compounds, Group II-V compounds, Group III-VI compounds, Group III-V compounds, Group IV-VI compounds, Group I—III-VI compounds, Group II-IV-VI compounds, Group II-IV-V compounds, or any combination thereof; and ii) a polymer for hole injection or hole transport layer, wherein the polymer comprises, as polymerized units, at least one or more monomers having a first monomer structure comprising a) a polymerizable group, wherein the polymerizable groups are selected from an ethenyl group, trifluorovinylether, cinnamate or chalcone, diene, ethoxyethyne and 3-ethoxy-4-methylcyclobut-2-enone, b) an electroactive group with formula $NAr_1Ar_2Ar_3$ wherein $Ar_1$, $Ar_2$ and $Ar_3$ independently are C6-C50 aromatic substituents, and (c) a linker group connecting the polymerizable group and the electroactive group.

2. The quantum dot light emitting device according to claim 1, wherein the poly a molecular weight of at least 5,000, and no greater than 10,000,000.

3. The quantum dot light emitting device according to claim 1, wherein the electroactive group having formula $NAr_1Ar_2Ar_3$ contains the followings:

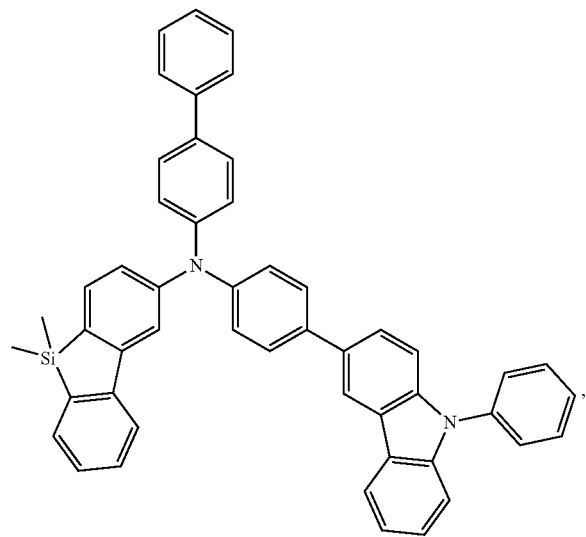
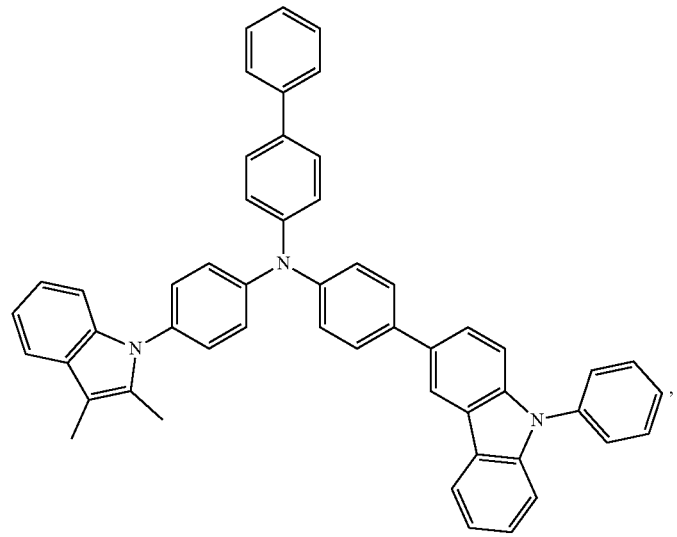
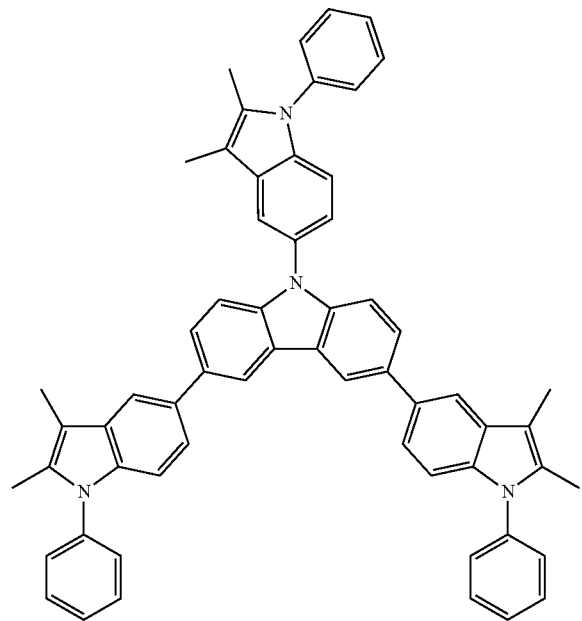

-continued
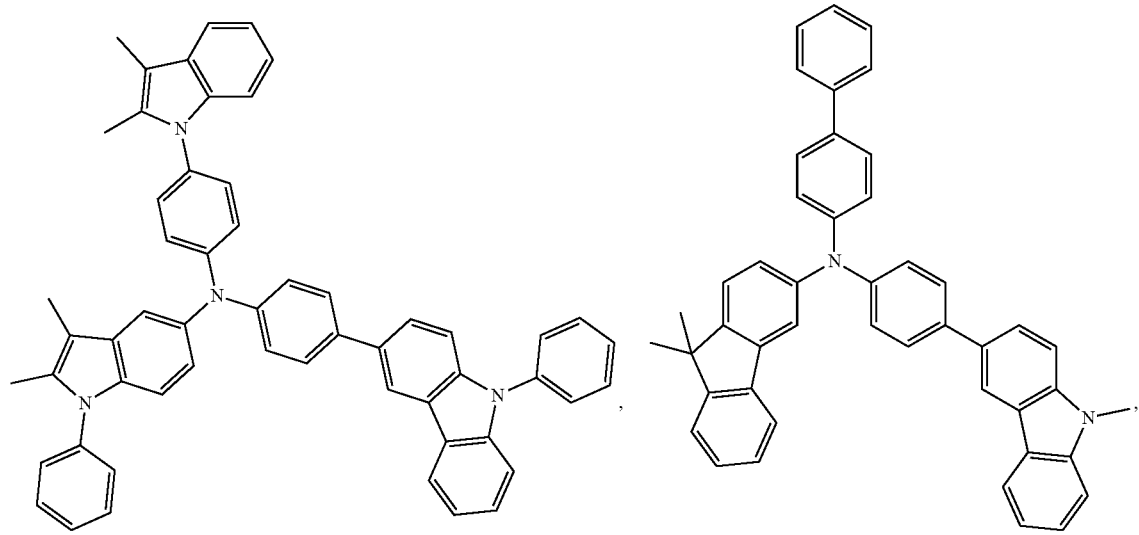
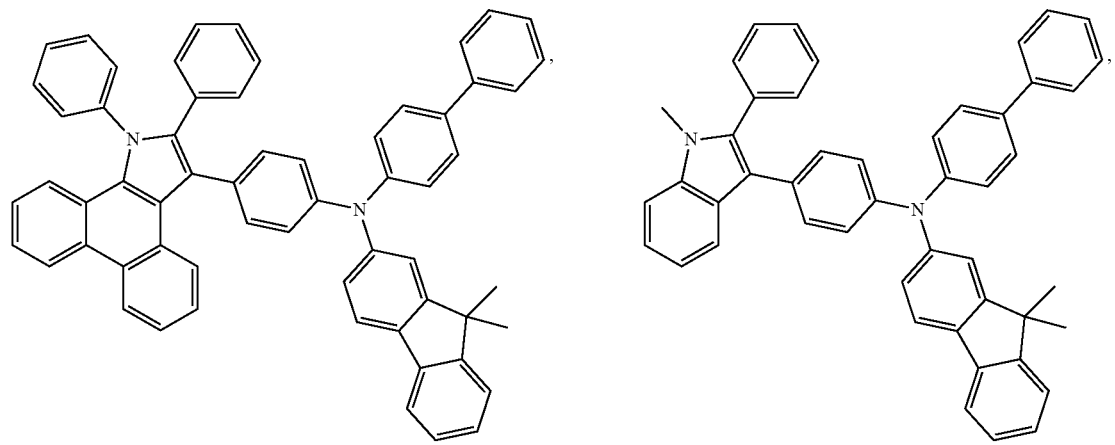
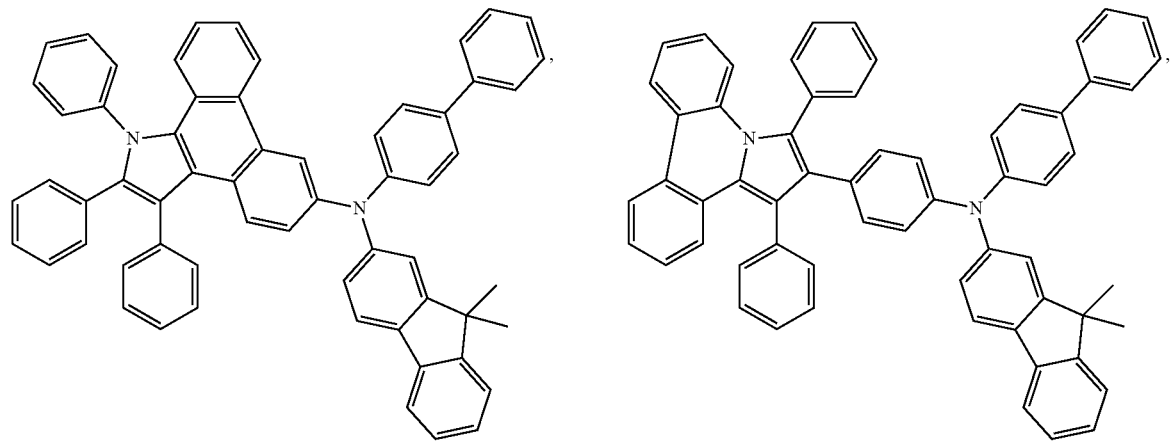

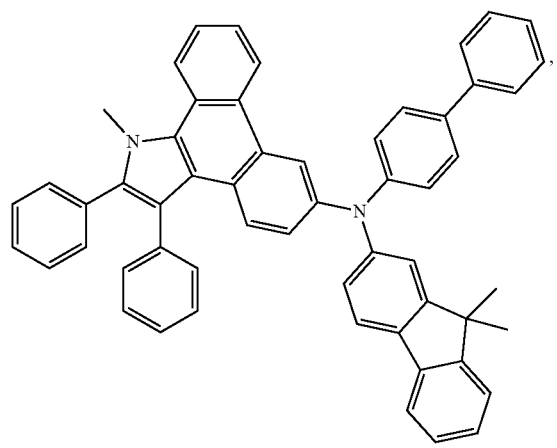
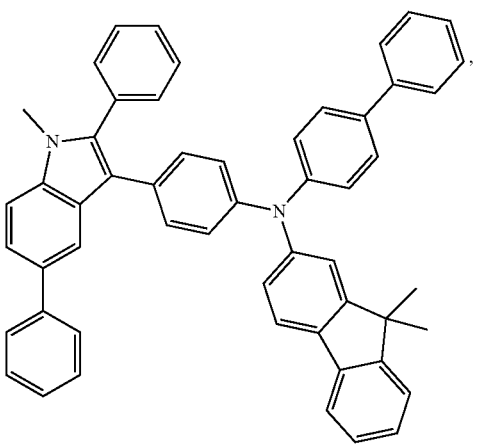
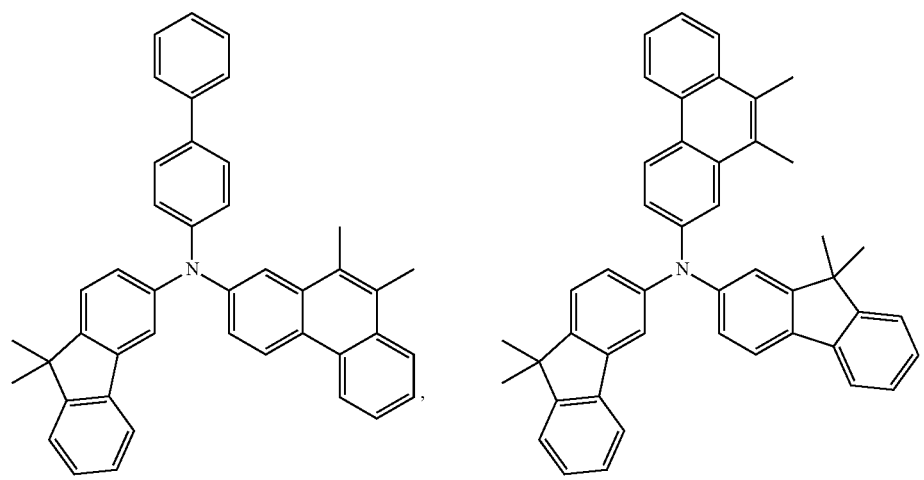
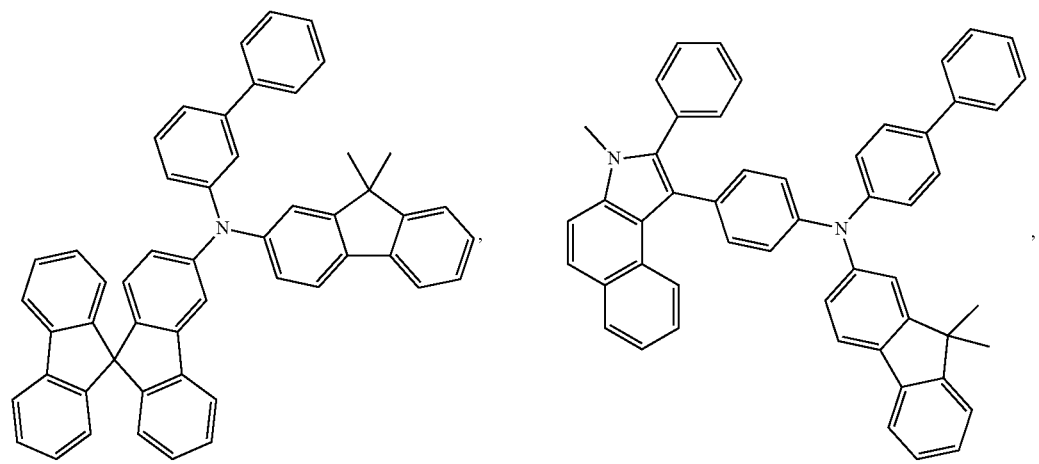

-continued
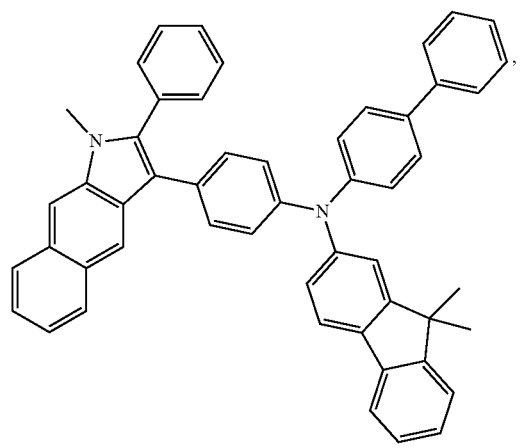
,
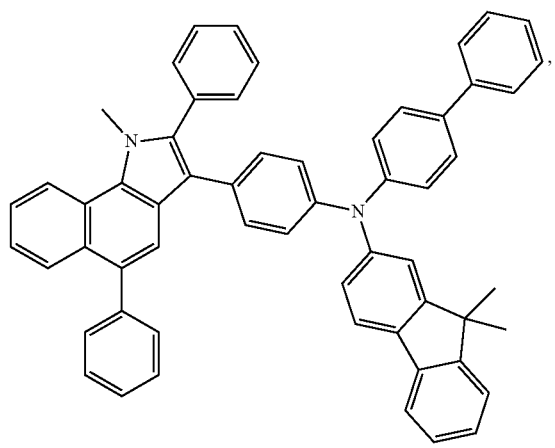
,
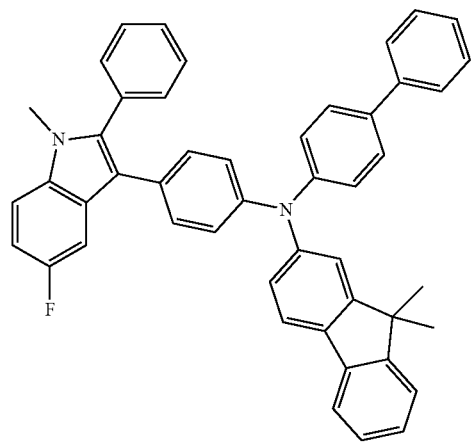
,
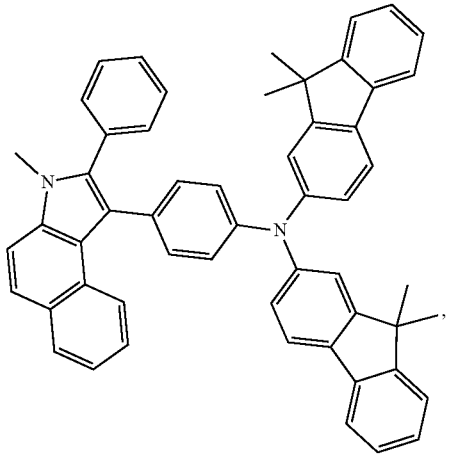
,
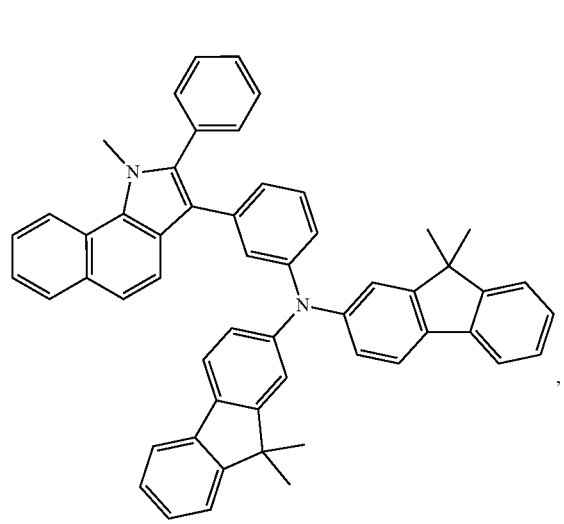
,
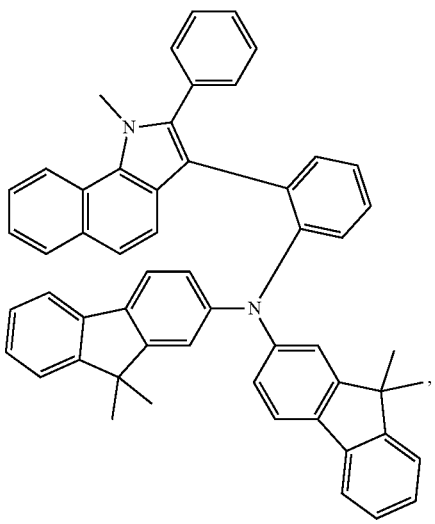
,

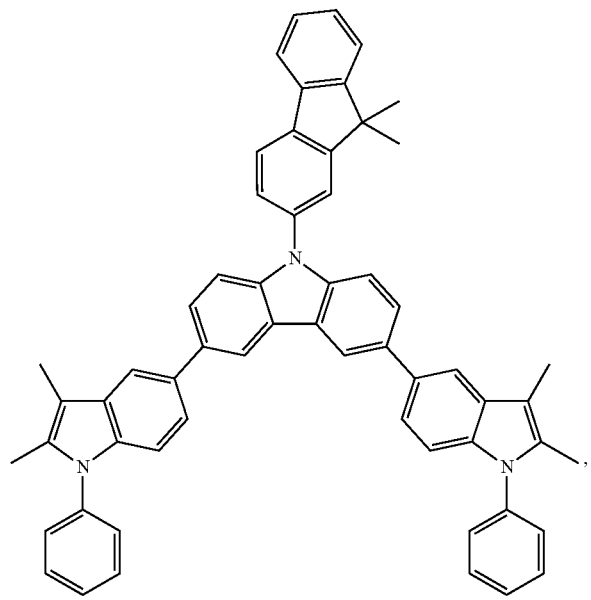
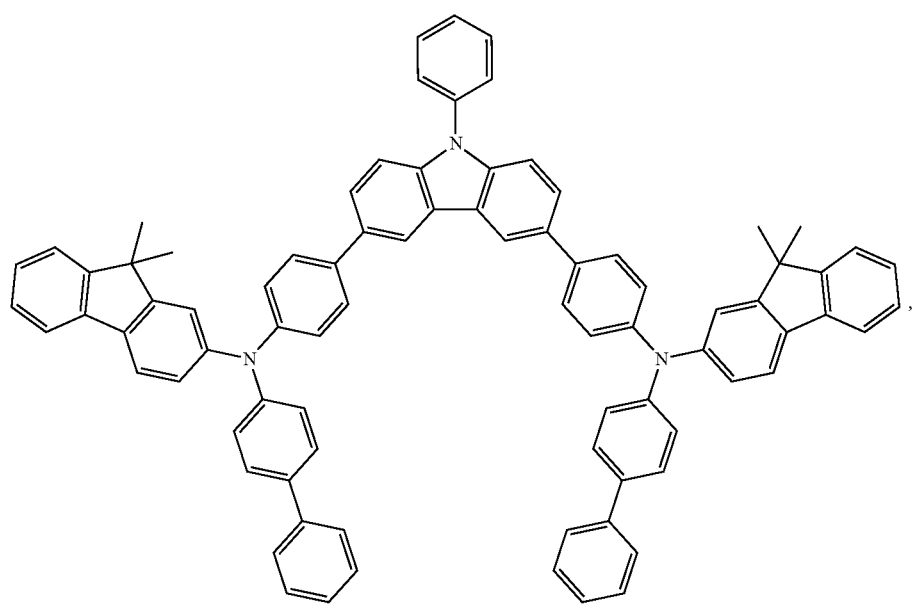 [SMILES: CC1(C)c2ccccc2-c2ccc(N(c3ccc(-c4ccccc4)cc3)c3ccc(-c4ccc5c(c4)c4cc(-c6ccc(N(c7ccc(-c8ccccc8)cc7)c7ccc8c(c7)C(C)(C)c7ccccc7-8)cc6)ccc4n5-c4ccccc4)cc3)cc21]

-continued
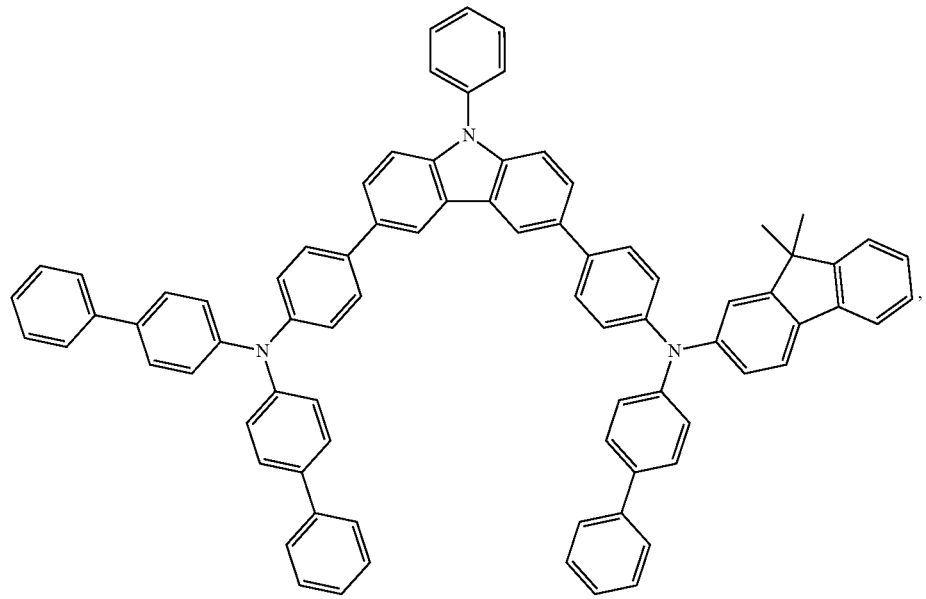
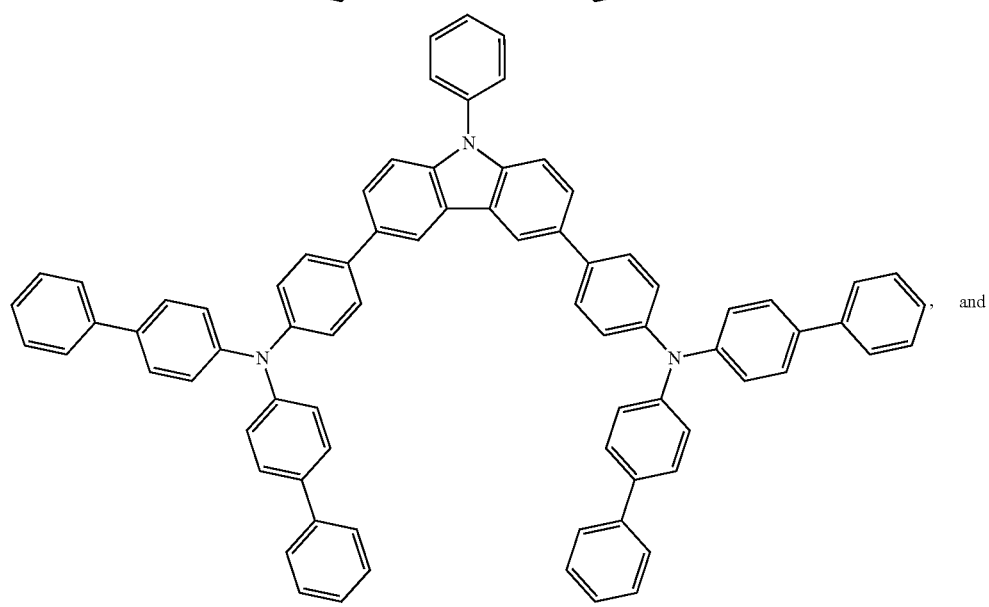
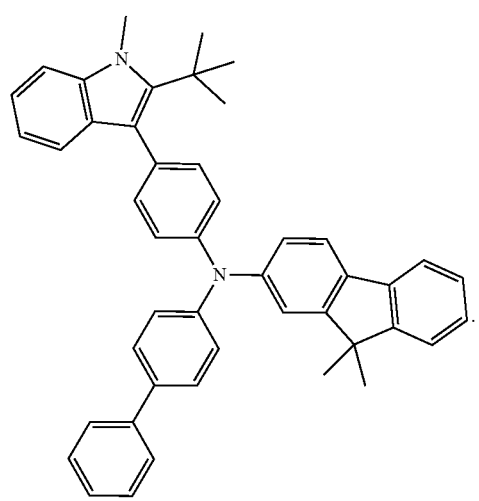

4. The quantum dot light emitting device according to claim 1, wherein the polymer further comprises a second monomer selected from
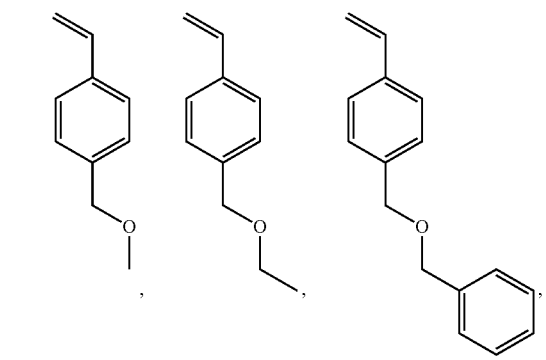
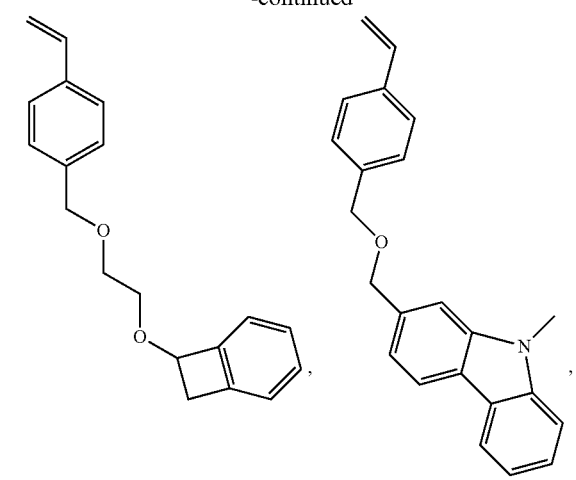
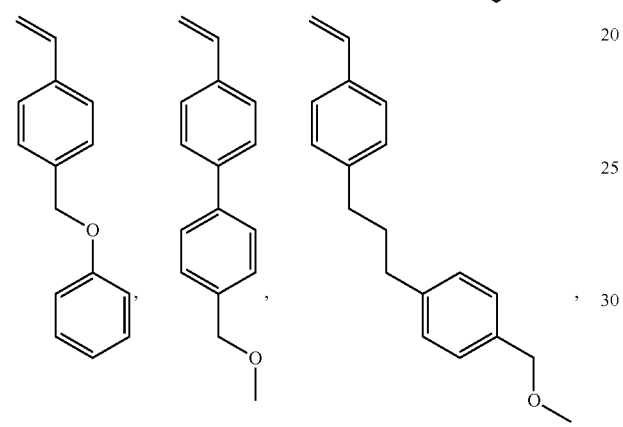
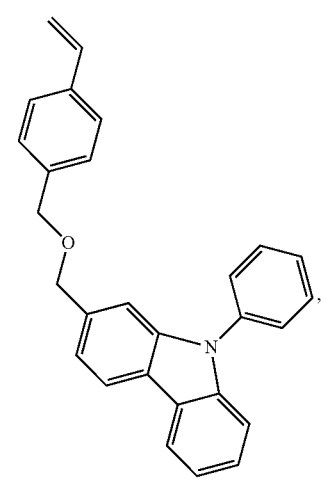
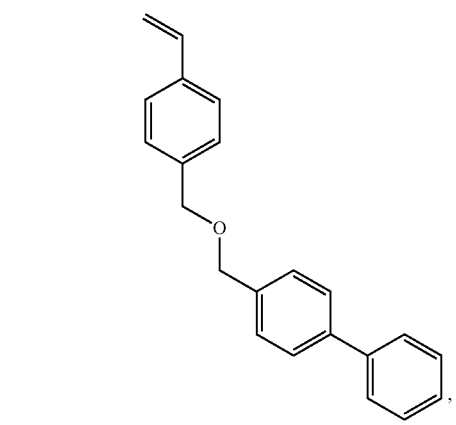
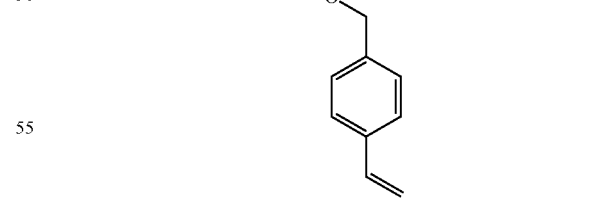
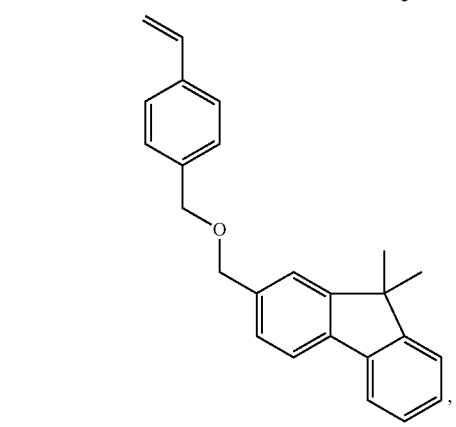
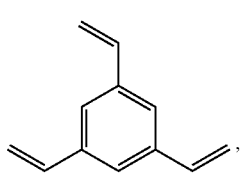

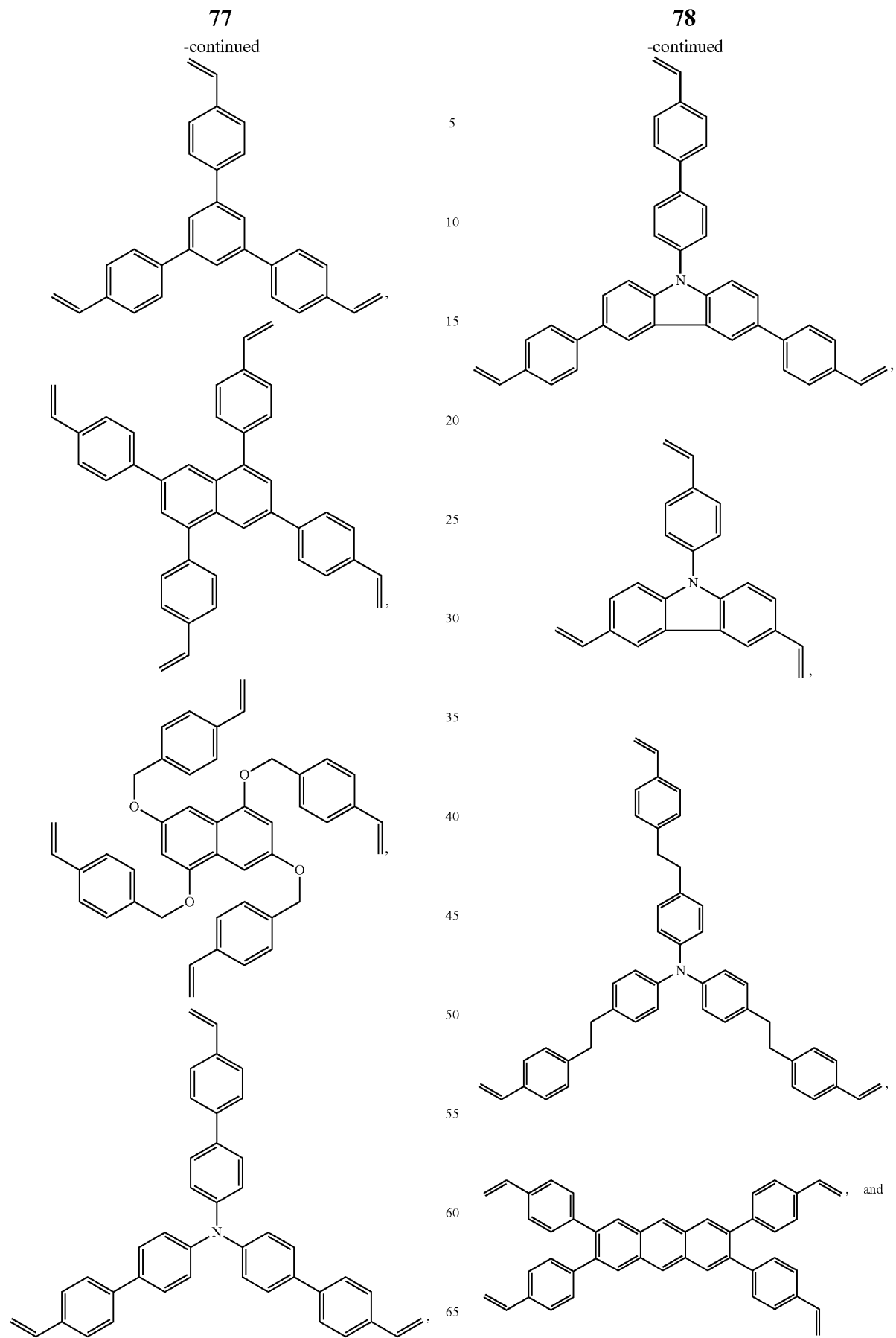

-continued

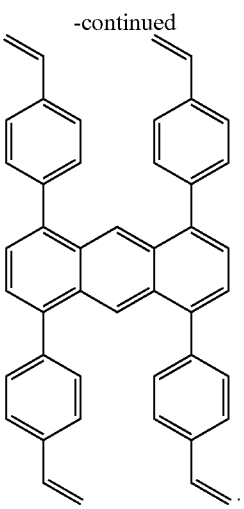

5. The quantum dot light emitting device according to claim 1, wherein the linker group is selected from the group consisting of a covalent bond; —O—; -alkylene-; -arylene-; -alkylene-arylene-; -arylene-alkylene-; —O-alkylene-; —O-arylene-; —O— alkylene-arylene-; —O-alkylene-O—; —O-alkylene-O-alkylene-O—; —O-arylene-O—; —O— alkylene-arylene-O—; —O—(CH2CH2-O)n-, wherein n is an integer from 2 to 20; —O— alkylene-O-alkylene-; —O-alkylene-O-arylene-; —O-arylene-O—; —O-arylene-O-alkyene-; and —O-arylene-O-arylene.

6. The quantum dot light emitting device according to claim 1, wherein the polymer further comprises a p-dopant.

7. The quantum dot light emitting device according to claim 1, wherein the semiconductor nanoparticles are doped with rare earth elements, transition metal elements, or any combination thereof.

8. The quantum dot light emitting device according to claim 1, wherein the semiconductor nanoparticles have a core-shell structure whereby an additional material is coated on the outside of an inner portion of the semiconductor nanoparticle, and the additional material is selected from the group consisting of Group IV compounds, Group II-VI compounds, Group II-V compounds, Group III-VI compounds, Group III-V compounds, Group IV-VI compounds, Group compounds, Group H—IV-VI compounds, Group II-IV-V compounds, or any combination thereof.

9. The quantum dot light emitting device according to claim 1, wherein the semiconductor nanoparticles have at least one dimension 100 nanometers or less in length.

10. The quantum dot light emitting device according to claim 1, wherein the semiconductor nanoparticles comprise a one-dimensional nanoparticle that has disposed at either or each end a single endcap or a plurality of endcaps that contact the one-dimensional nanoparticle.

* * * * *